United States Patent [19]
Lai

[11] Patent Number: 5,791,928
[45] Date of Patent: Aug. 11, 1998

[54] ZERO INSERTION/EXTRACTION FORCE SOCKET

[76] Inventor: Kuang-Chih Lai, No. 2, Lane 10, Sheng-Li Street, Tu-Cheng City, Teipei Hsien, Taiwan

[21] Appl. No.: 557,624

[22] Filed: Nov. 14, 1995

Related U.S. Application Data

[63] Continuation-in-part of Ser. No. 552,931, Nov. 3, 1995.
[51] Int. Cl.$^6$ ..................................... H01R 4/50
[52] U.S. Cl. ..................................... 439/342
[58] Field of Search ..................... 439/259, 261, 439/263, 264, 265, 342, 266, 268, 269.1

[56] References Cited

U.S. PATENT DOCUMENTS

| | | | |
|---|---|---|---|
| 4,245,877 | 1/1981 | Auriana | 439/342 X |
| 4,349,239 | 9/1982 | Roberts et al. | 439/342 X |
| 4,531,792 | 7/1985 | Oshitani et al. | 439/342 X |
| 5,057,031 | 10/1991 | Sinclair | 439/261 |

*Primary Examiner*—Khiem Nguyen
*Attorney, Agent, or Firm*—Morton J. Rosenberg; David I. Klein

[57] ABSTRACT

A zero insertion/extraction force socket adapted to be mounted on a printed circuit board. The socket includes an insulative housing having multiple insertion holes for conductive contacts to insert thereinto, multiple insertion pins of an integrated circuit being inserted into the insertion holes to contact with the conductive contacts, and two fulcrum dents disposed on or near two edges of the housing for a pushing piece to insert thereinto. Each fulcrum dent serves as a leverage fulcrum, enabling the pushing piece to directly push/lever an edge of the integrated circuit and shift the integrated circuit on an insertion face of the housing with the insertion pins of the integrated circuit moving from a loosening position where the insertion pins loosen from the conductive contacts to a contacting position where the insertion pins contact with the conductive contacts or moving from the contacting position to the loosening position.

13 Claims, 27 Drawing Sheets

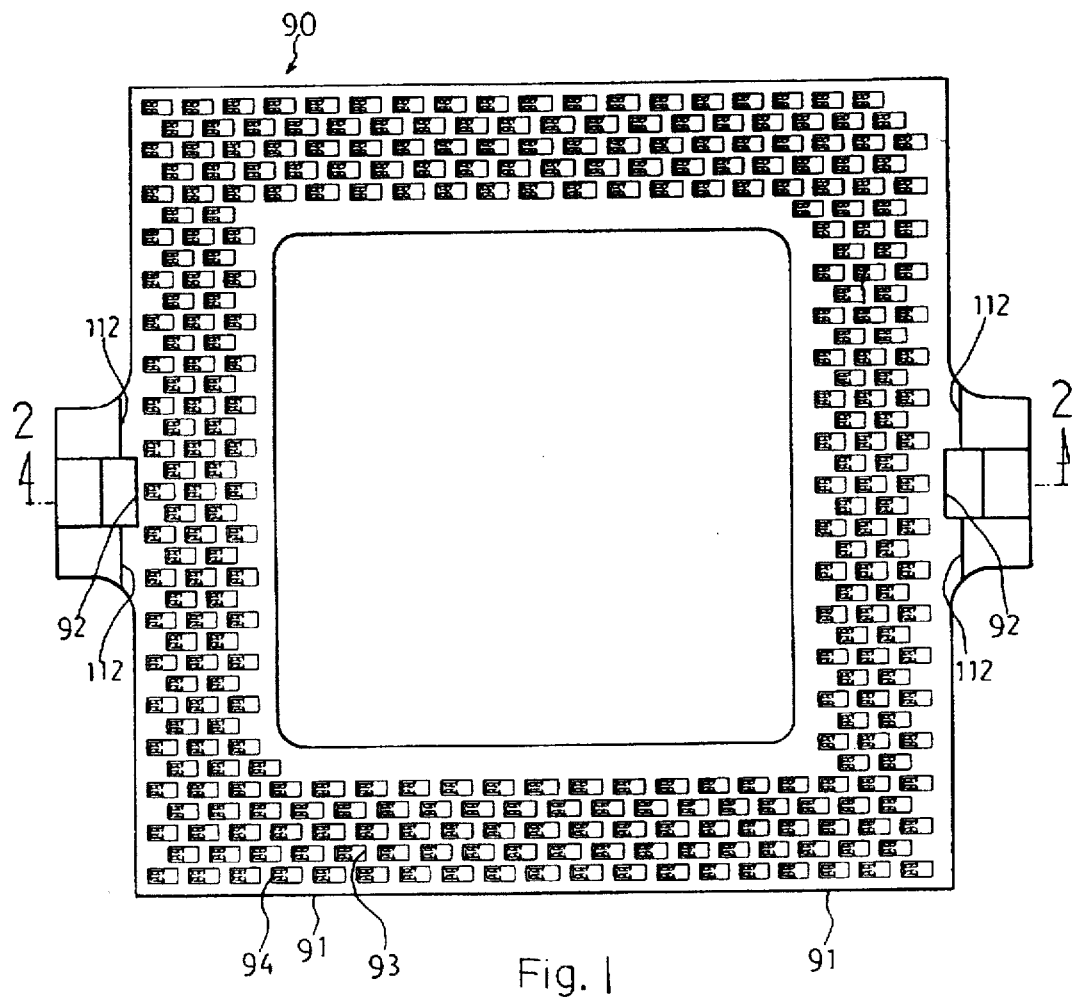
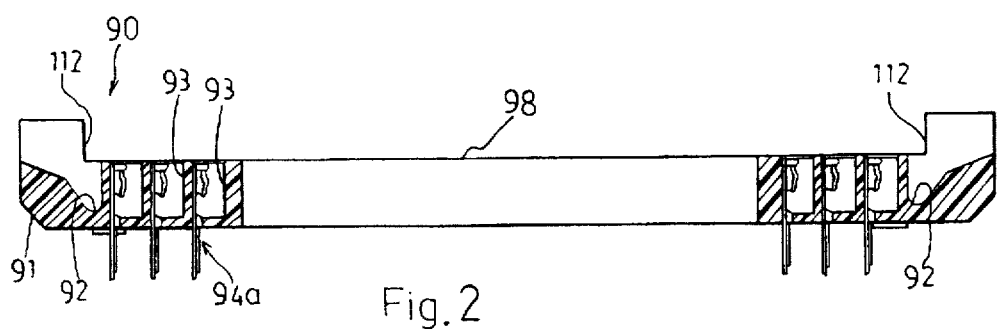
Fig. 1
Fig. 2

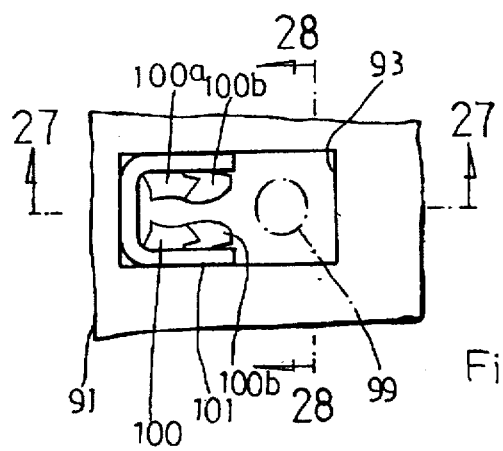
Fig.26
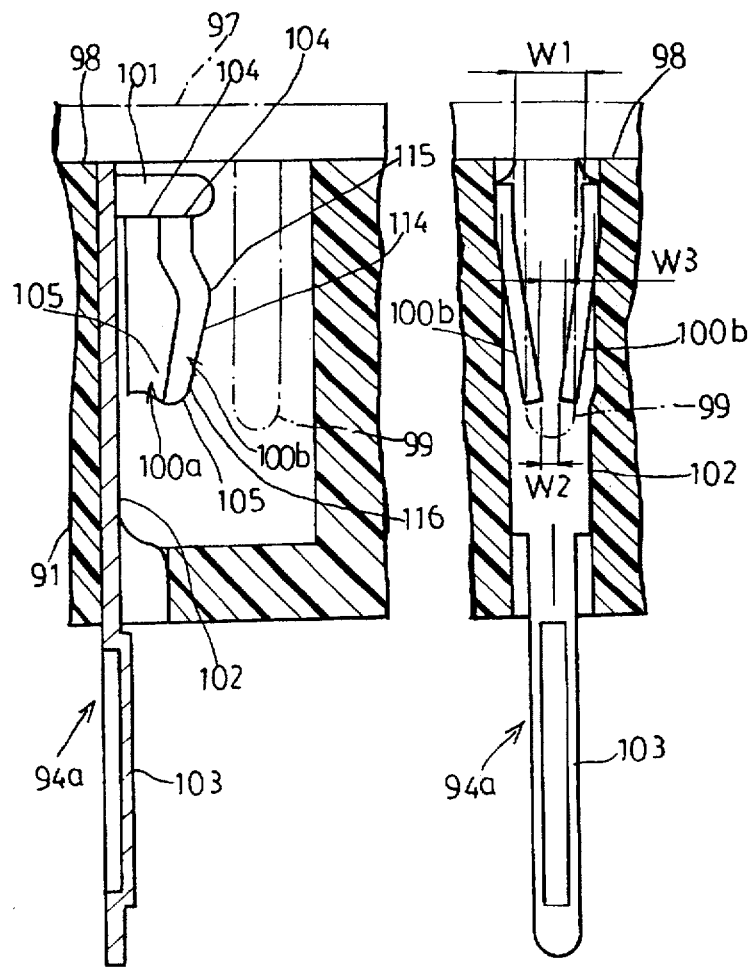
Fig.27
Fig.28
Fig.29

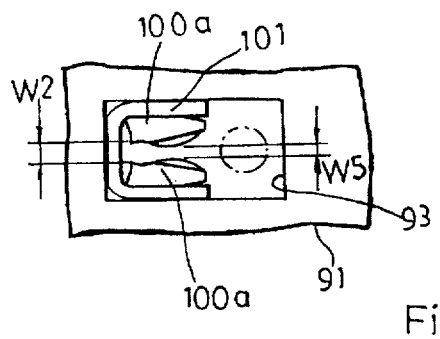
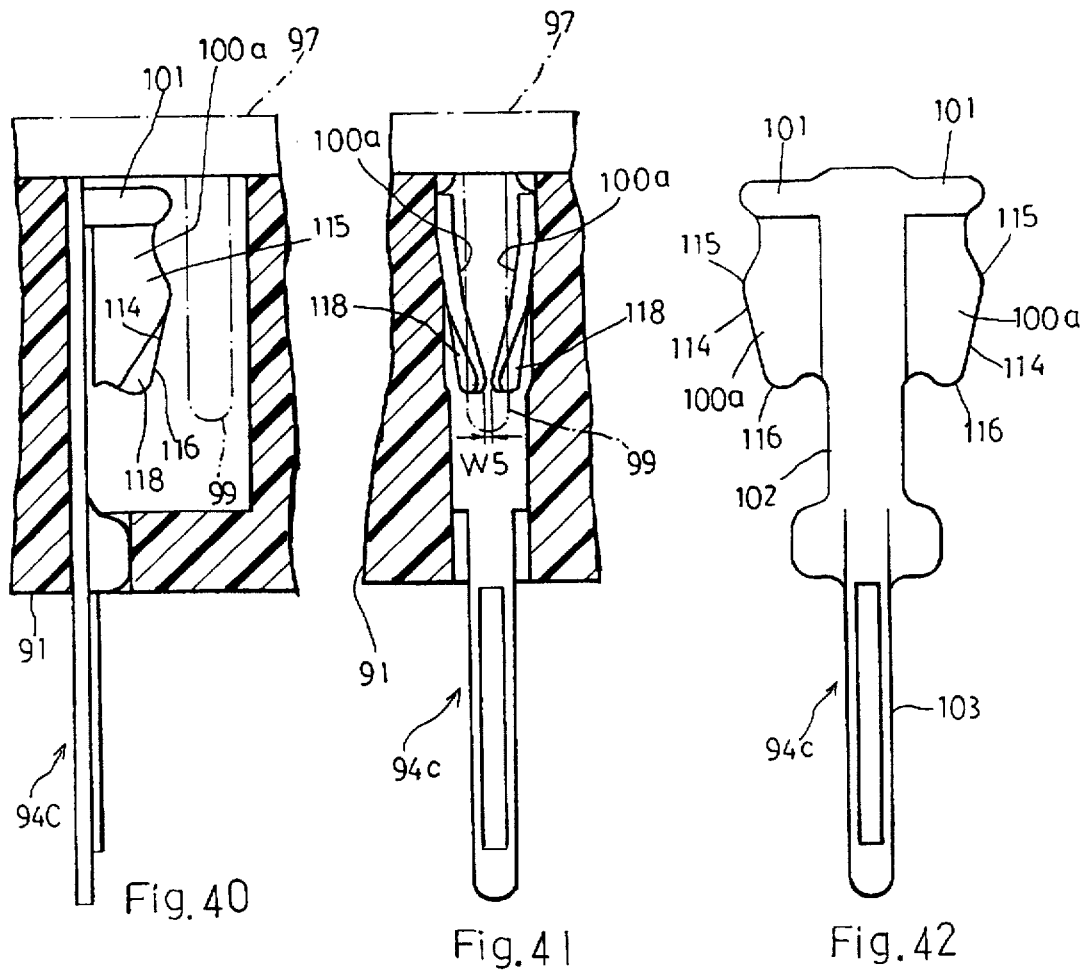
Fig. 39
Fig. 40
Fig. 41
Fig. 42

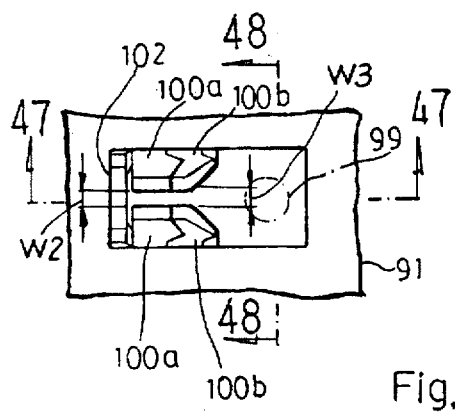
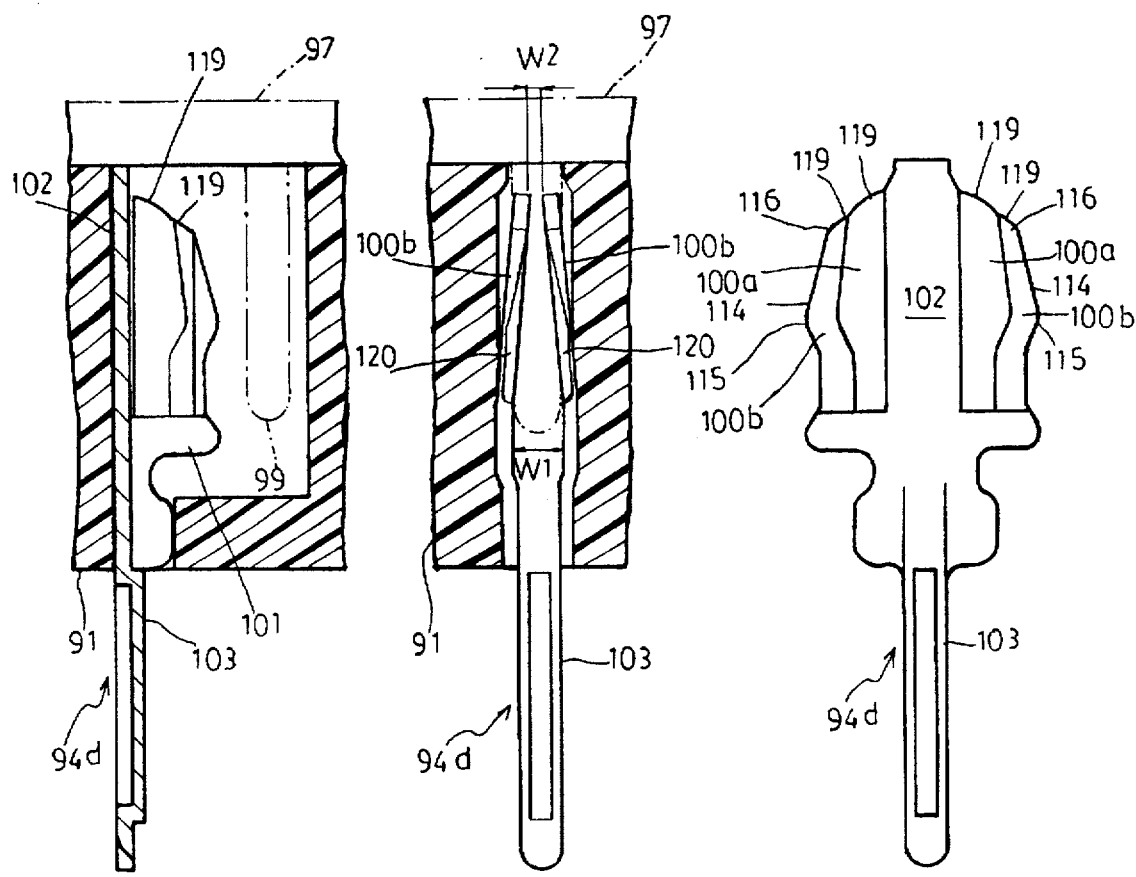
Fig.46
Fig.47  Fig.48  Fig.49

ZERO INSERTION/EXTRACTION FORCE SOCKET

CROSS-REFERENCE TO RELATED APPLICATION

This application is a Continuation-in-Part Application of U.S. patent application Ser. No. 08/552,931, entitled "A Zero Extraction Force Socket", filed on 3 Nov., 1995, now pending.

BACKGROUND OF THE INVENTION

1. Field of the Invention

The present invention relates to a zero insertion/extraction force socket in which the sliding member and operation arm of the conventional zero insertion/extraction force socket are eliminated so as to minimize the socket.

2. Description of the Prior Art

It is known that a personal computer is equipped with a CPU chip which is inserted in a socket in the computer. For the purpose of progression, the CPU may be replaced by a more advanced one after a period of use. At this time, the CPU must be extracted from the socket and the more advanced one must be inserted into the socket instead. In order to facilitate the insertion/extraction operation, a zero insertion/extraction force socket is developed. A user can easily insert the CPU into the socket or extract the CPU therefrom without exerting much strength.

As shown in FIGS. 67 and 68, such zero insertion/extraction force socket includes a housing 81 and a sliding member 82 slidable on the housing 81. The housing 81 is formed with an array of insertion holes (not shown) and multiple conductive contacts 83 are inserted in the insertion holes. In addition, an L-shaped operation arm 84 is pivotally disposed on one side of the housing 81. By means of pivoting the operation arm 84, the sliding member 82 is forced to slide in a direction of arrow 85 so as to shift an integrated circuit (CPU) inserted into the socket. Therefore, the terminals or insertion pins of the integrated circuit are forced to contact with the conductive contacts 83 or loosen therefrom. Accordingly, the purpose of zero insertion/extraction force is achieved.

Because such zero insertion/extraction force socket includes the sliding member 82 and the operation arm 84, the space occupied by the socket is considerably large. This fails to meet the commercial requirement of minimization of any electronic part. Therefore, it is necessary to simplify and minimize the conventional zero insertion/extraction force socket.

It is therefore an object of the present invention to provide a zero insertion/extraction force socket which has simplified structure and minimized volume.

The present invention can be best understood through the following description and accompanying drawings, wherein:

BRIEF DESCRIPTION OF THE DRAWINGS

FIG. 1 is a top view of a first embodiment of the zero insertion/extraction force socket of the present invention;

FIG. 2 is a sectional view taken along line 2—2 of FIG. 1;

FIG. 26 is a top view of a first embodiment of the conductive contact of the present invention, wherein the insertion pin does not contact with the conductive contact;

FIG. 27 is a sectional view taken along line 27—27 of FIG. 26;

FIG. 28 is a sectional view taken along line 28—28 of FIG. 26;

FIG. 29 is a front stretched view of the conductive contact of FIG. 28;

FIG. 39 is a top view of the conductive contact of FIG. 36, wherein the insertion pin is extracted from the insertion hole;

FIG. 40 is a left view of the conductive contact of FIG. 36;

FIG. 41 is a front view of the conductive contact of FIG. 36;

FIG. 42 is a front stretched view of the conductive contact of FIG. 36;

FIG. 46 is a top view of the conductive contact of FIG. 43, wherein the insertion pin is extracted from the insertion hole;

FIG. 47 is a left view of the conductive contact of FIG. 43;

FIG. 48 is a front view of the conductive contact of FIG. 43;

FIG. 49 is a front stretched view of the conductive contact of FIG. 43;

DETAILED DESCRIPTION OF THE PREFERRED EMBODIMENTS

Figure 66:
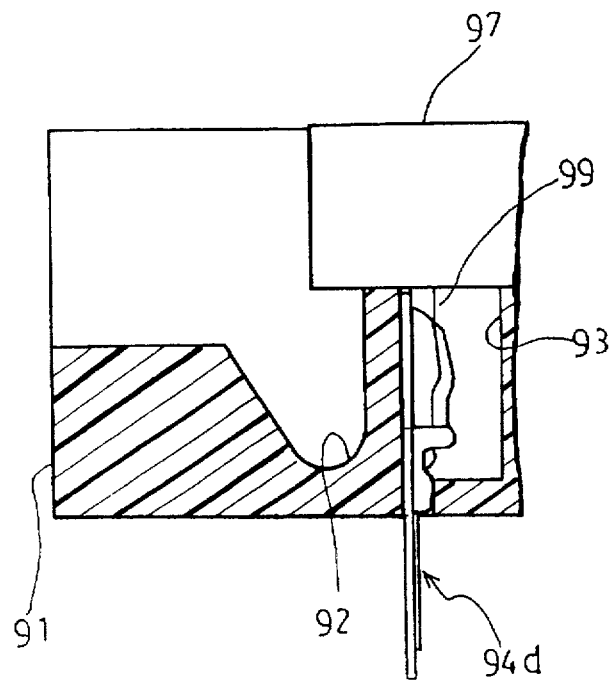
FIG. 66 is a partially enlarged view of area 66 of FIG. 62.
Figure 67:
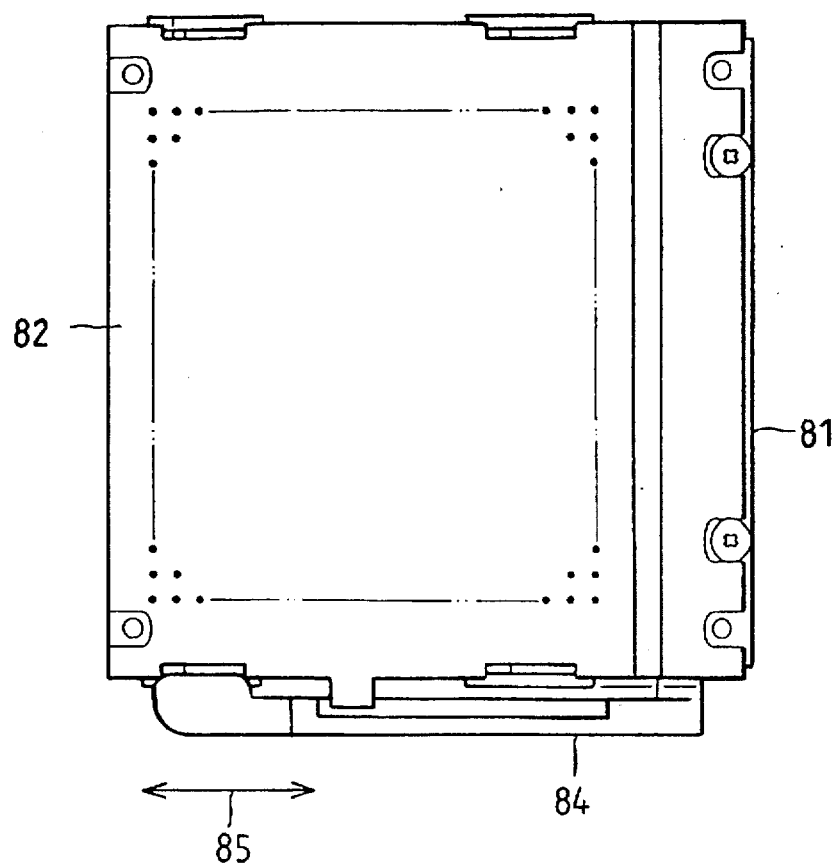
FIG. 67 is a top view of a conventional zero insertion/ extraction force socket.
Figure 68:
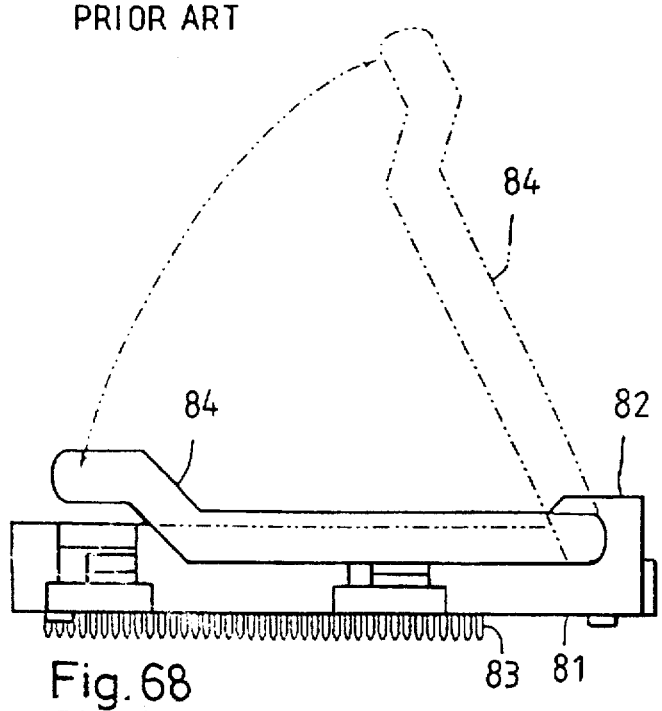
FIG. 68 is a side view of the socket of FIG. 67.

Please refer to FIGS. 1 to 66. The zero insertion/extraction force socket 90 of the present invention includes an insulative housing 91 and two fulcrum dents 92. The housing 91 is formed with multiple insertion holes 93 for conductive contacts 94a, 96b, 94c, 94d, 94e (as shown in FIGS. 1 to 66) to be inserted therein. The fulcrum dents 92 are disposed on or near two opposite edges of the housing 91, so that a pushing piece 96 (such as a screwdriver or other flat elongated piece) can be selectively inserted into the fulcrum dents 92 to push/lever an integrated circuit 97 with the fulcrum dents 92 serving as leverage fulcrums. Alternatively, as shown in FIGS. 15 to 22, an assistant pushing member 95 is inserted in each fulcrum dent 92, whereby the pushing piece 66 first pushes the assistant pushing member 95 and then the assistant pushing member 95 pushes the integrated circuit 97 inserted in the housing 91. Accordingly, the integrated circuit 97 is shifted on an insertion face 98 of the housing 91 with the insertion pins 99 of the integrated circuit 97 moving from a loosening position where the insertion pins 99 do not contact with the conductive contacts 94a, 94b yet (as shown in FIGS. 9, 26 to 28, 33 to 35, 39 to 41, 46 to 48, 53 to 55 and 65) to a contacting position where the insertion pins 99 contact with the conductive contacts 94a, 94b, 94c, 94d, 94e (as shown in FIGS. 10, 23 to 25, 30 to 32, 36 to 38, 43 to 45, 50 to 52 and 66) or moving from a contacting position where the insertion pins 99 contact with the conductive contacts 94a, 94b to a loosening position where the insertion pins 99 loosen from the conductive contacts 94a, 94b.

Figure 13:
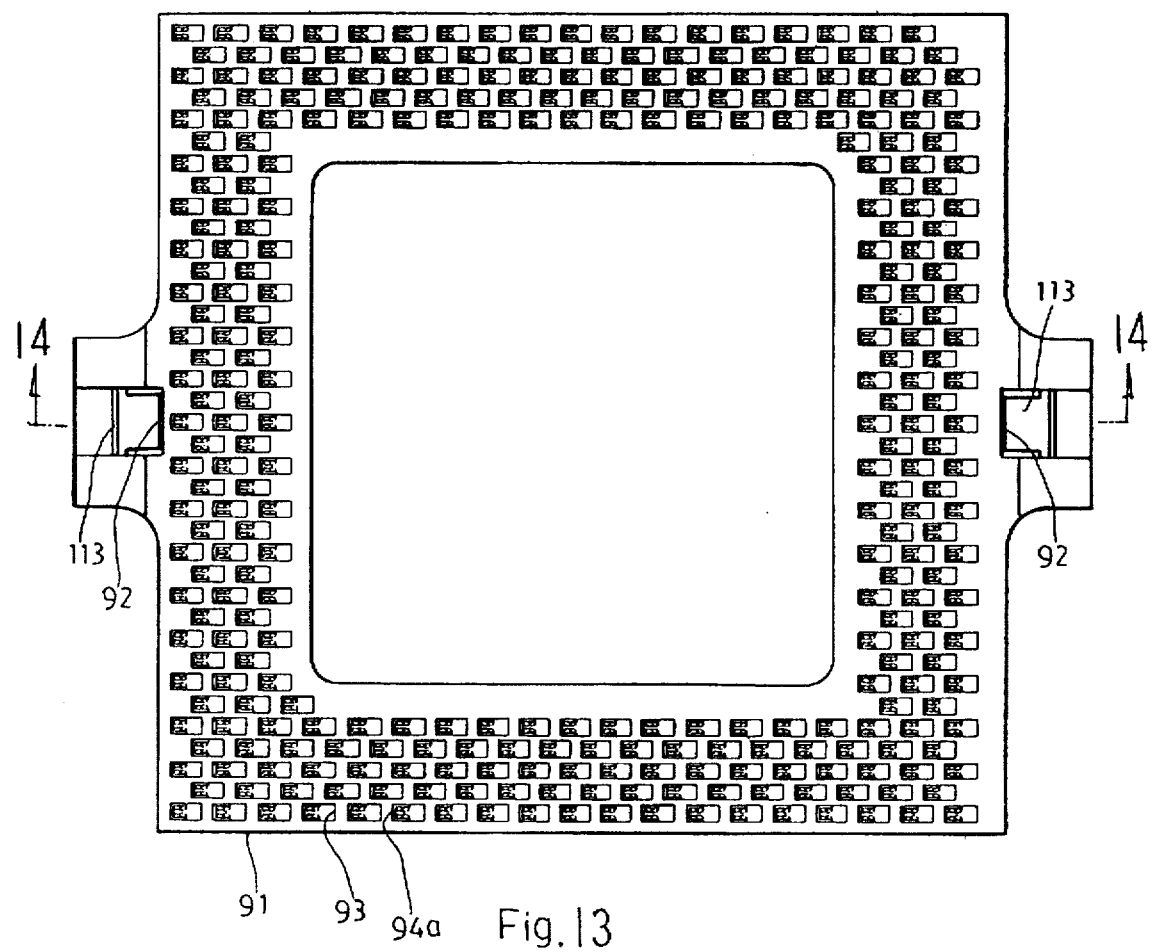
FIG. 13 is a top view of a third embodiment of the zero insertion/extraction force socket of the present invention.
Figure 14:
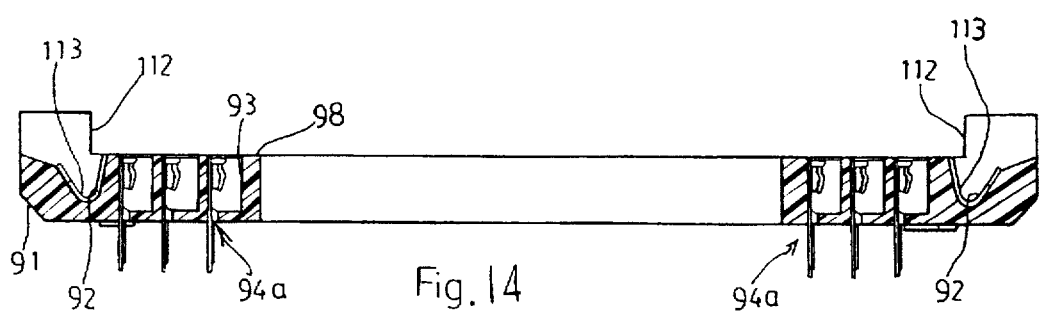
FIG. 14 is a sectional view taken along line 14—14 of FIG. 11.

Alternatively, as show n in FIGS. 13 and 14, a metal protective member 113 is further inserted in the fulcrum dent 92 to form a hard and anti-abrasion surface on the surface of the fulcrum dent 92 for preventing the plastic surface of the fulcrum dent 92 from being scraped by the pushing piece 96.

Figure 3:
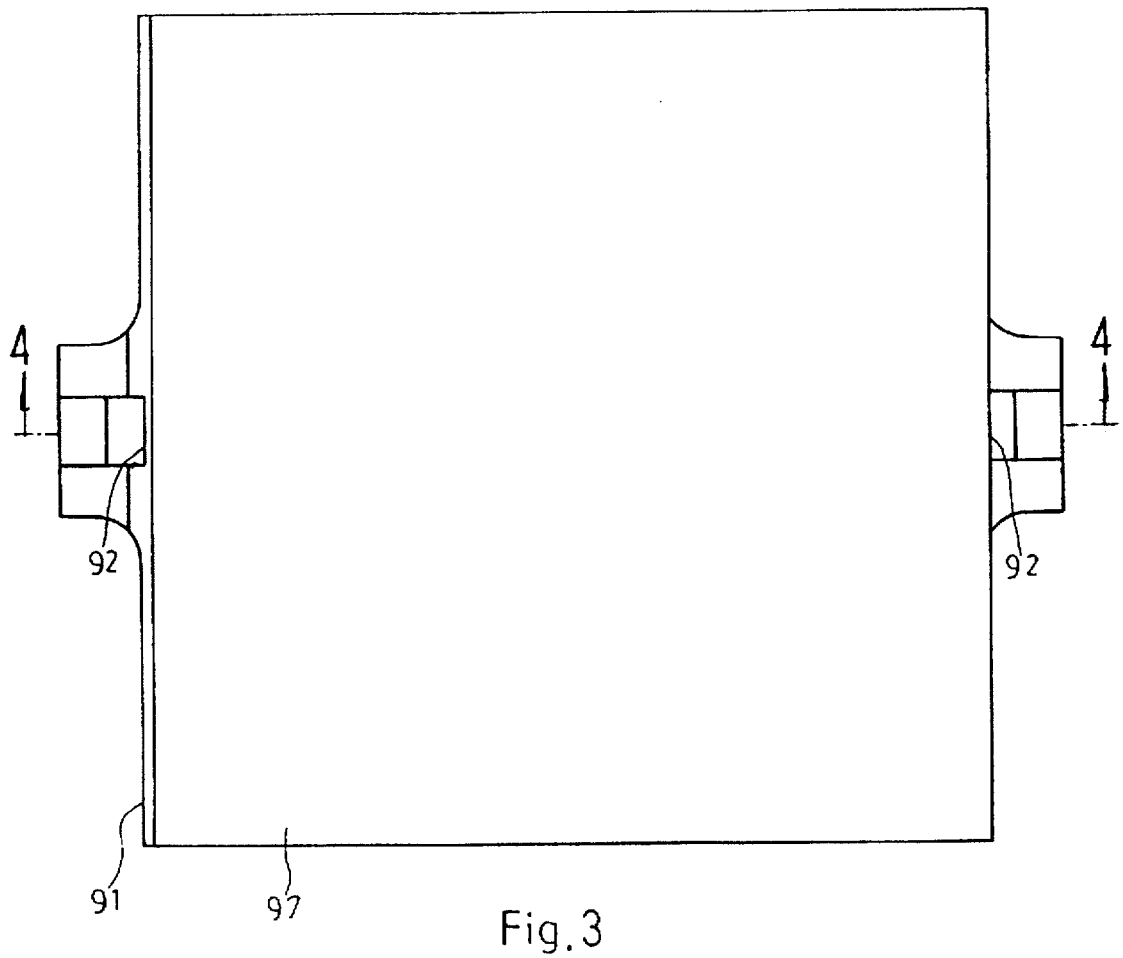
FIG. 3 is a top view showing that the insertion pins of the integrated circuit are inserted into the insertion holes of the socket of FIG. 1, prior to being slid into a contacting position.
Figure 4:
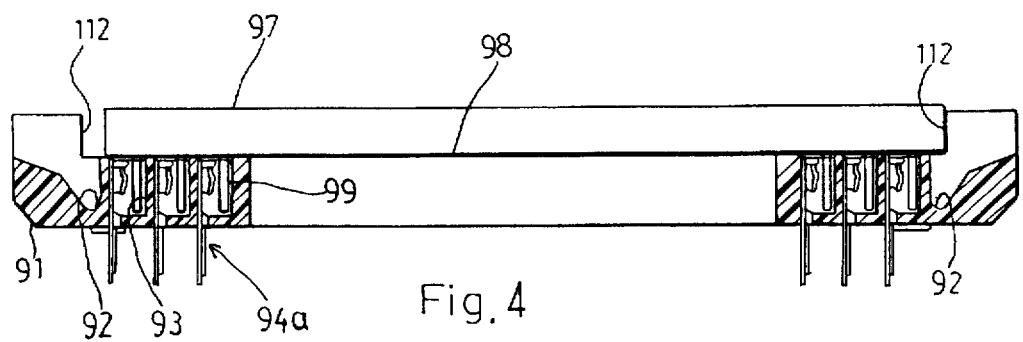
FIG. 4 is a sectional view taken along line 4—4 of FIG. 3.
Figure 5:
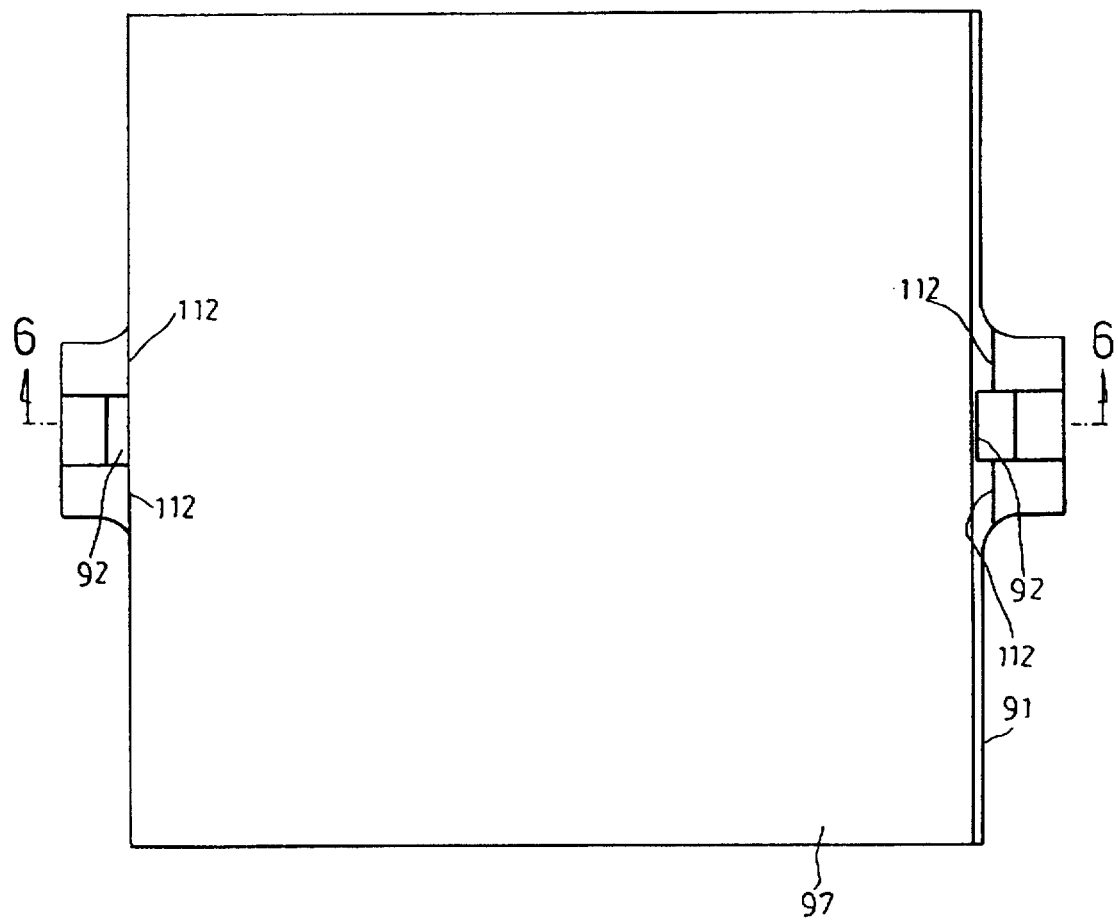
FIG. 5 is a top view according to FIG. 3, showing that a pushing piece such as a screwdriver is inserted into the right fulcrum dent to leftward push the insertion pins of the integrated circuit toward the contacting position.
Figure 6:
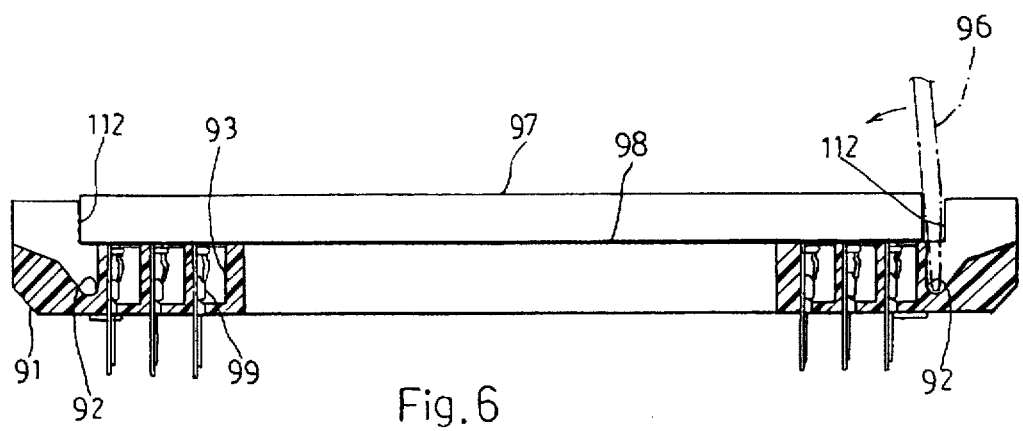
FIG. 6 is a sectional view taken along the line 6—6 of FIG. 5.
Figure 7:
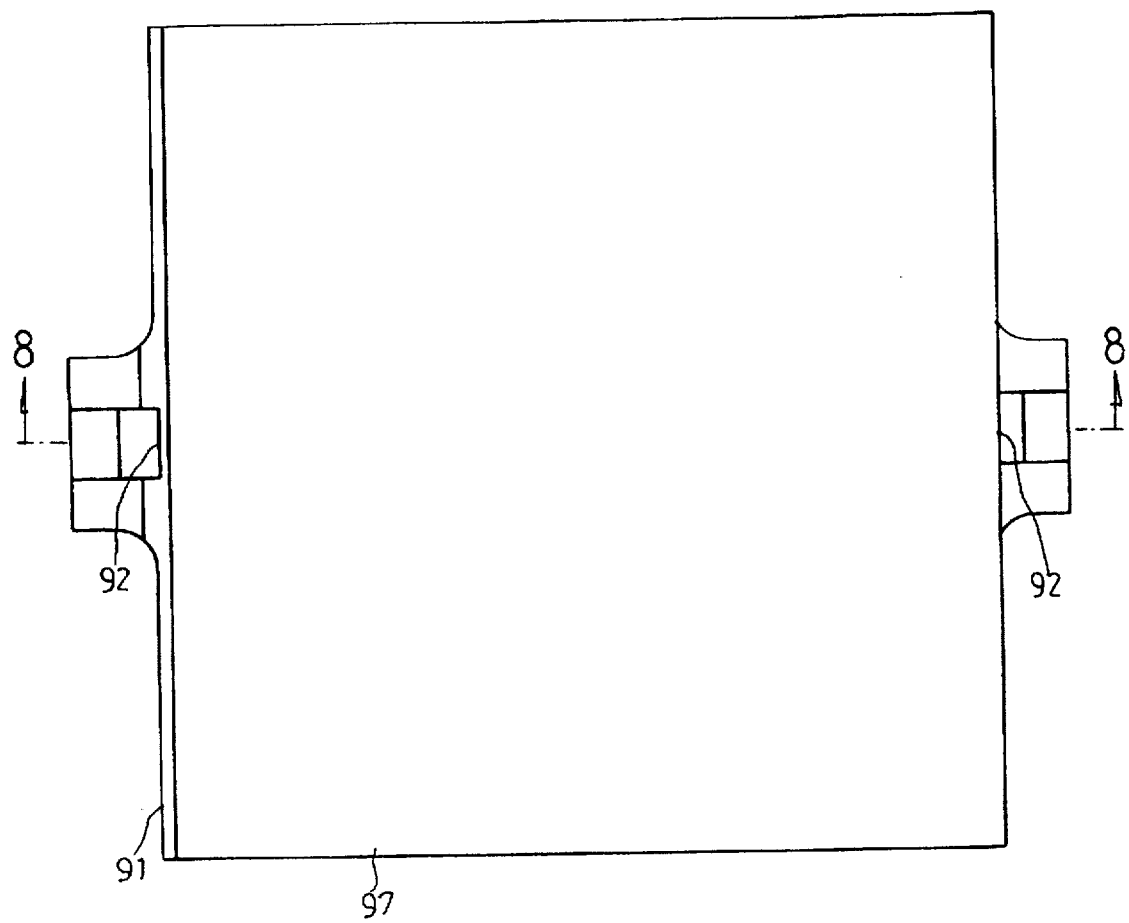
FIG. 7 is a top view according to FIG. 5, showing that the pushing piece is inserted into the left fulcrum dent to rightward push the insertion pins of the integrated circuit toward the loosening position, permitting the integrated circuit to be extracted from the socket with substantially zero force.
Figure 8:
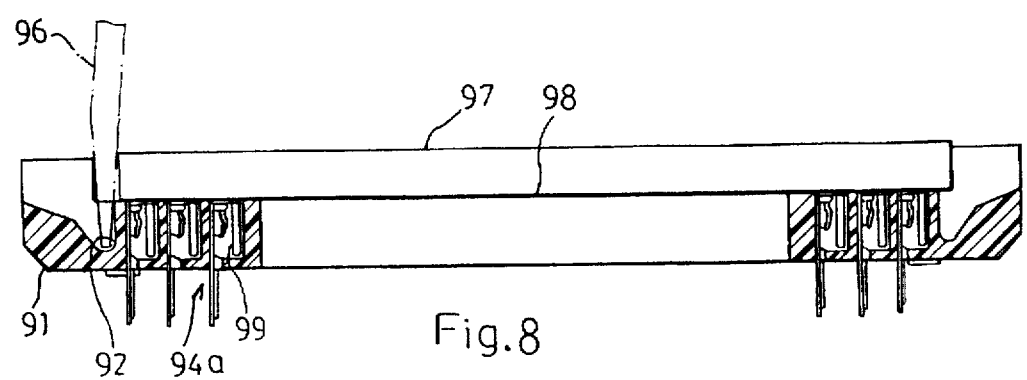
FIG. 8 is a sectional view taken along line 8—8 of FIG. 7.
Figure 9:
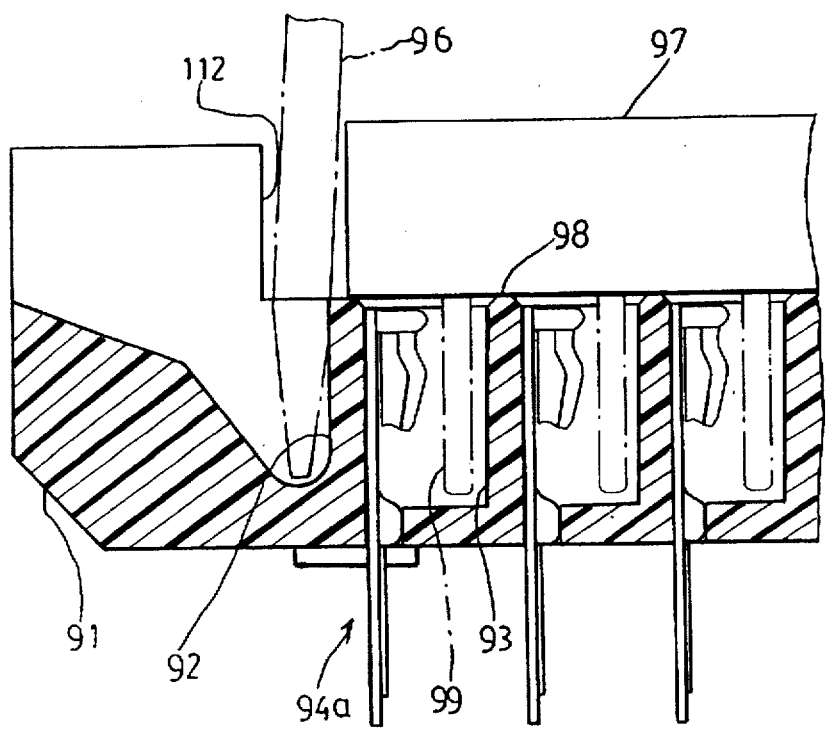
FIG. 9 is a partially enlarged view of area 9 of FIG. 8.
Figure 10:
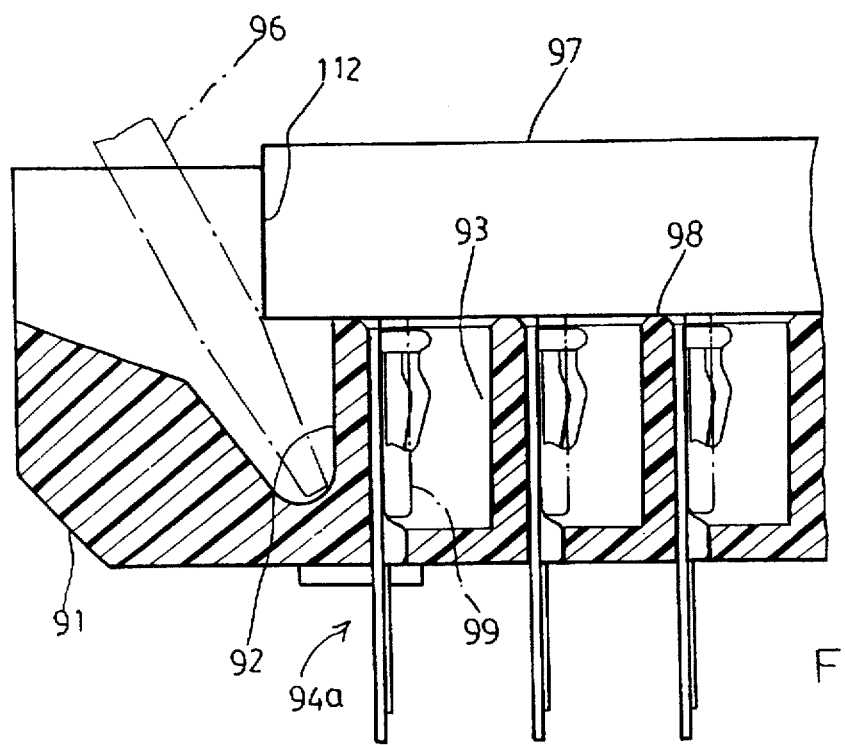
FIG. 10 is a partially enlarged view of area 10 of FIG. 6.
Figure 11:
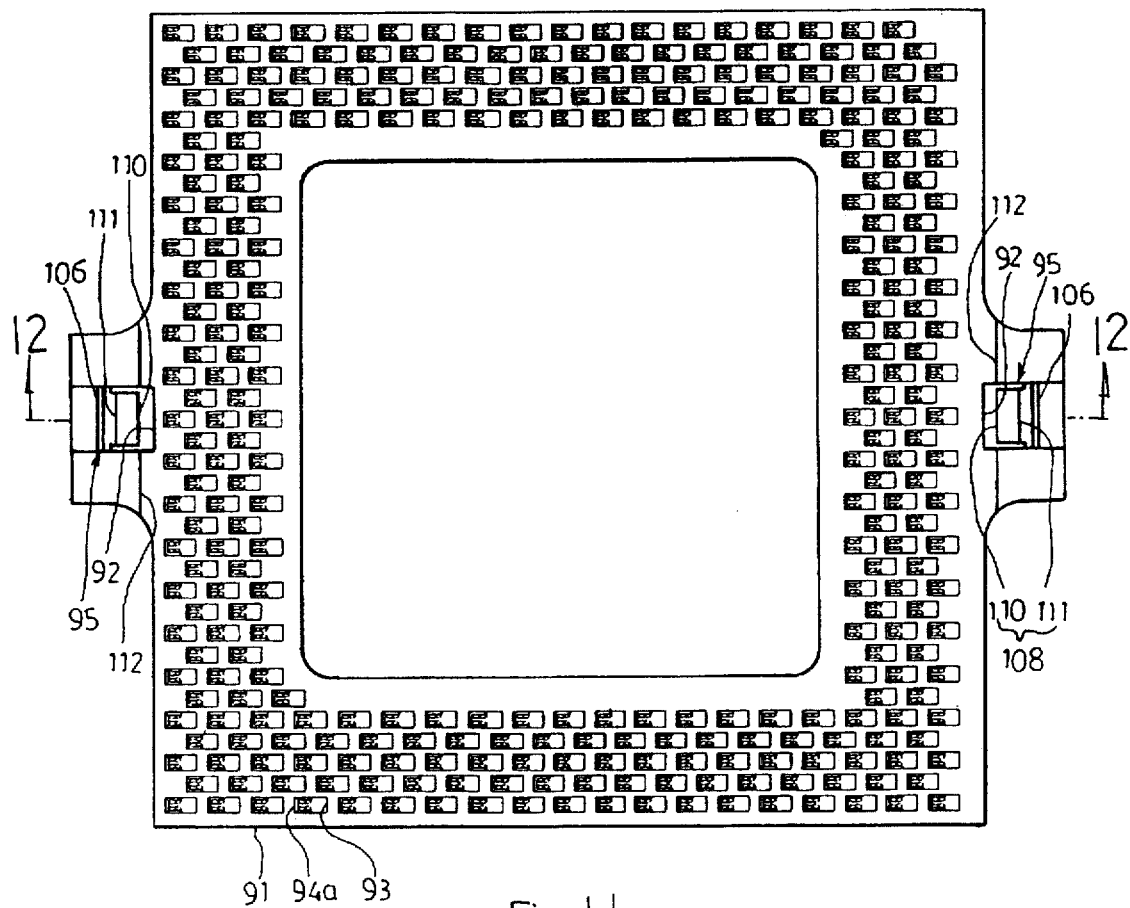
FIG. 11 is a top view of a second embodiment of the zero insertion/extraction force socket of the present invention.
Figure 12:
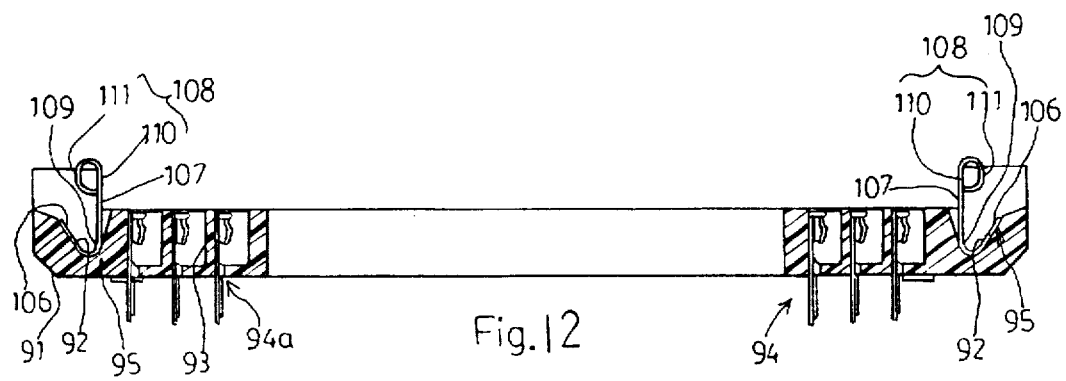
FIG. 12 is a sectional view taken along line 12—12 of FIG. 11.

Referring to FIGS. 11 and 12, the pushing member 95 is disposed in the fulcrum dent 92, having an insertion section 106, a resilient section 107 and a pushing section 108. The insertion section 106 is inserted in the fulcrum dent 92 and the resilient section 107 integrally extends from the insertion section 106 to form a fulcrum concave portion 109 for contacting with the pushing piece 96 and providing a leverage fulcrum therefor. The pushing section 108 is integrally connected with an end of the resilient section 107, having a pushing face 110 and a pushed face 111. The pushing face 110 serves to push an edge of the integrated circuit 97, while the pushed face 111 contacts with the pushing piece 96 inserted in the fulcrum dent 92 and is pushed by the pushing piece 96.

The pushing member 95 is made of metal material and formed with a U-shaped or V-shaped resilient structure. The pushing piece 96 pushes the pushing member 95 and the pushing member 95 in turn pushes the integrated circuit 97. Therefore, the pushing piece 96 is prevented from impacting and damaging the integrated circuit 97 or the cooling fan disposed thereon.

Referring to FIGS. 3 to 6, when the integrated circuit 67 is inserted into a first embodiment of the socket as shown in FIGS. 1 and 2, the insertion pins 99 of the integrated circuit 97 are positioned right above and aligned with the insertion holes 93 and then inserted thereinto. However, when doing this, two conditions may occur. One condition is that the edge of the integrated circuit 97 is right aligned with a locating edge 112 of the fulcrum dent 92 and thus the insertion pins 99 of the integrated circuit 97 are right properly downward inserted into the tight contacting position of the conductive contacts 94a. Under such circumstance, it is unnecessary to use the pushing piece to push the integrated circuit 97. The other condition is that the insertion pins 99 of the integrated circuit 97 are inserted into the loosening position of the conductive contacts 94a. Under such circumstance, it is necessary to use the pushing piece to push the integrated circuit 97 inserted in the housing 91 so as to move the insertion pins 99 from the loosening position to the contacting position.

Please refer to FIGS. 23 to 29. According to a first embodiment of the conductive contact 94a, the contact 94a includes a U-shaped base section 101, four resilient sections 100a, 100b downward extending from the base section 101, a main stem section 102 connected with the base section 101 and an insertion leg section 103 downward extending from the main stem section 102. The base section 101 is attached to a lateral wall of the insertion hole 93 with the resilient sections 100a, 100b downward extending from the base section 101, so that the insertion pin 99 of the integrated circuit 97 can be smoothly slid over the base section 101 and inserted into the resilient sections 100a, 100b and tightly clamped therein.

Please refer to FIGS. 23 to 29. The four resilient sections 100a, 100b are each resiliently biased. Two resilient sections 100a of the four resilient sections are respectively adjacent to two edges of the main stem section 102, while the other two resilient sections 100b are respectively adjacent to the two resilient sections 100a. Each of the two resilient sections 100a is interposed between one of the other two resilient sections 100b and the main stem section 102. Each of the four resilient sections 100a, 100b has a first end 104 and a second end 105, wherein the first ends of the two resilient sections 100a are integrally connected with the base section 101. The width between the first ends 104 of the two resilient sections 100a is defined as the first width W1, while the width between the second ends 105 thereof is defined as the second width W2. The first width W1 is larger than the diameter D or width of the insertion pin 99 of the integrated circuit 97, while the second width W2 is less than the diameter D or width of the insertion pin 99. Similarly, the first ends of the two resilient sections 100b are integrally connected with the base section 101. The width between the first ends 104 of the two resilient sections 100b is also defined as the first width W1, while the width between the second ends 105 thereof is defined as the third width W3. The first width W1 is larger than the diameter D or width of the insertion pin 99 of the integrated circuit 97, while the third width W3 is less than the diameter D or width of the insertion pin 99. The second width W2 can be equal to or unequal to the third width W3.

In addition, on a right lower edge of each of the resilient sections 100b is formed an inclined guide side 114 which is inclined leftward downward as shown in FIG. 27. A starting point 115 of the guide side 114 is positioned between the first end 104 and second end 105 of the resilient section 100b, while an ending point 116 of the guide side 114 is positioned at the second end 105 of the resilient section 100b. Also, the perpendicular distance from the starting point 115 of the guide side 114 to the main stem section 102 is larger than the perpendicular distance from the ending point 116 of the guide side 114 to the main stem section 102. When the insertion pins 99 of the integrated circuit 97 are shifted leftward from the loosening position to the contacting position as shown in FIG. 27, the insertion pins 99 will be smoothly slid into the U-shaped base section 101 having the first width W1 which is larger than the diameter D of the insertion pins 99. Then the insertion pins 99 will contact with the guide sides 114 to be guided thereby and easily slid into the space between the resilient sections 100a, 100b.

Please refer to FIGS. 30 to 35. According to a second embodiment of the conductive contact, the contact 94b includes a U-shaped base section 101, two resilient sections 100a downward extending from the base section 101 and having inclined guide sides 114, a main stem section 102 connected under the base section 101 and an insertion leg section 103 integrally downward extending from the main stem section 102. The second embodiment is similar to the first embodiment as shown in FIGS. 23 to 29 except that the second embodiment of the conductive contact 94b only has two resilient sections 100a. Moreover, on a lower edge of one or both of the resilient sections 100a is formed a clamping notch 117 dented toward the first end. The width between the two clamping notches 117 of the resilient sections 100a is defined as the fourth width W4. The fourth width W4 is less than the first width W1, while larger than the second width W2. Also, the fourth width W4 is less than the diameter D or width of the insertion pin 99, so that the insertion pin 99 is more firmly clamped between the clamping notches 117.

Please refer to FIGS. 36 to 42. According to a third embodiment of the conductive contact, the contact 94c includes a U-shaped base section 101, two resilient sections 100a downward extending from the base section 101 and having inclined guide sides 114 and clamping notches 117, a main stem section 102 connected under the base section 101 and an insertion leg section 103 downward extending from the main stem section 102. The third embodiment of the conductive contact is similar to the first embodiment as shown in FIGS. 30 to 35 except that the guide sides 114 of the two resilient sections 100a of the conductive contact 94c are formed with clamping bent portions 118 which are inward bent toward each other. The distance between the bent portions 118 is defined in the fifth width W5. The fifth width W5 is less than the second width W2, whereby the insertion pin 99 is more firmly and securely clamped between the resilient sections 100a.

Please refer to FIGS. 43 to 49. Accordingly to a fourth embodiment of the conductive contact, the contact 94d includes a U-shaped base section 101, two to four resilient sections 100a, 100b upward extending from a middle portion of the base section 101 and an insertion leg section 103 integrally downward extending from the middle portion of the base section 101. The four resilient sections 100a, 100b are each resiliently biased. Two resilient sections 100a of the four resilient sections are respectively adjacent to two edges of the main stem section 102, while the other two resilient sections 100b are respectively adjacent to the two resilient sections 100a. Each of the two resilient sections 100a is interposed between one of the other two resilient sections 100b and the main stem section 102. Each of the four resilient sections 100a, 100b has a first end and a second end, wherein the first ends of the two resilient sections 100a are integrally connected with the base section 101. The width between the first ends 104 of the two resilient sections 100a is defined as the first width W1, while the width between the seconds 105 thereof is defined as the second width W2. The first width W1 is larger than the diameter D or width of the insertion pin 99 of the integrated circuit 97, while the second width W2 is less than the diameter D or width of the insertion pin 99. Similarly, the first ends of the two resilient sections 100b are integrally connected with the base section 101. The width between the first ends 104 of the two resilient sections 100b is also defined as the first width W1, while the width between the second ends 105 thereof is defined as the third width W3. The first width W1 is larger than the diameter D or width of the insertion pin 99 of the integrated circuit 97, while the third width W3 is less than the diameter D or width of the insertion pin 99. The second width W2 can be equal to or unequal to the third width W3.

In order to facilitate the insertion of the insertion pins of the integrated circuit, a top end of each resilient section 100a, 100b of the conductive contact 94d as shown in FIGS. 43 to 49 is formed with an inclined guide side 119. When the insertion pins 99 of the integrated circuit 97 are inserted into the insertion holes 93, the insertion pins 99 will first contact with the guide sides 119 or arch sides of the resilient sections 100a, 100b to be guided into the insertion holes 93.

Figures 51, 52:
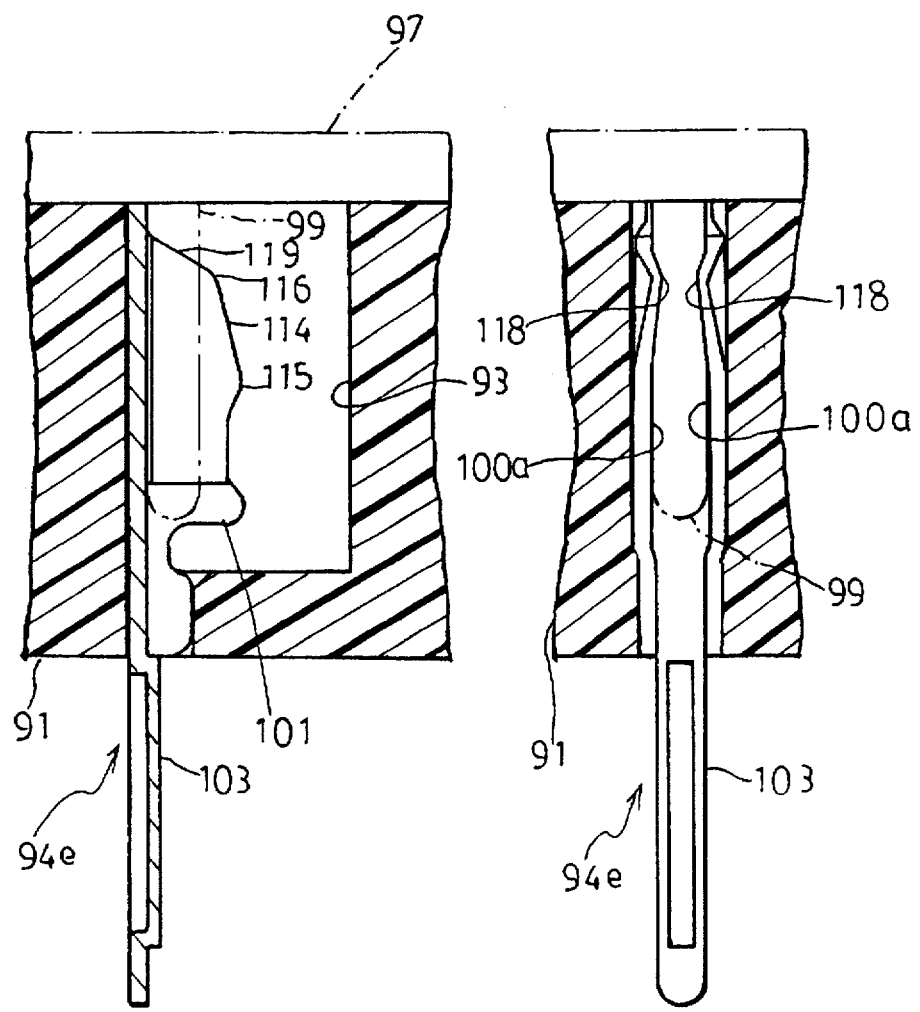
FIG. 51 is a sectional view taken along line 51—51 of FIG. 50.
FIG. 52 is a sectional view taken along line 52—52 of FIG. 50.
Figure 53:
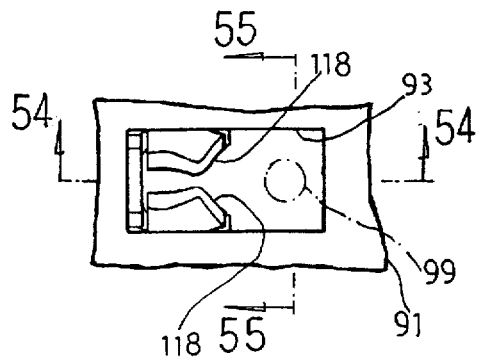
FIG. 53 is a top view of the conductive contact of FIG. 50, wherein the insertion pin is extracted from the insertion hole.
Figures 54, 55, 56:
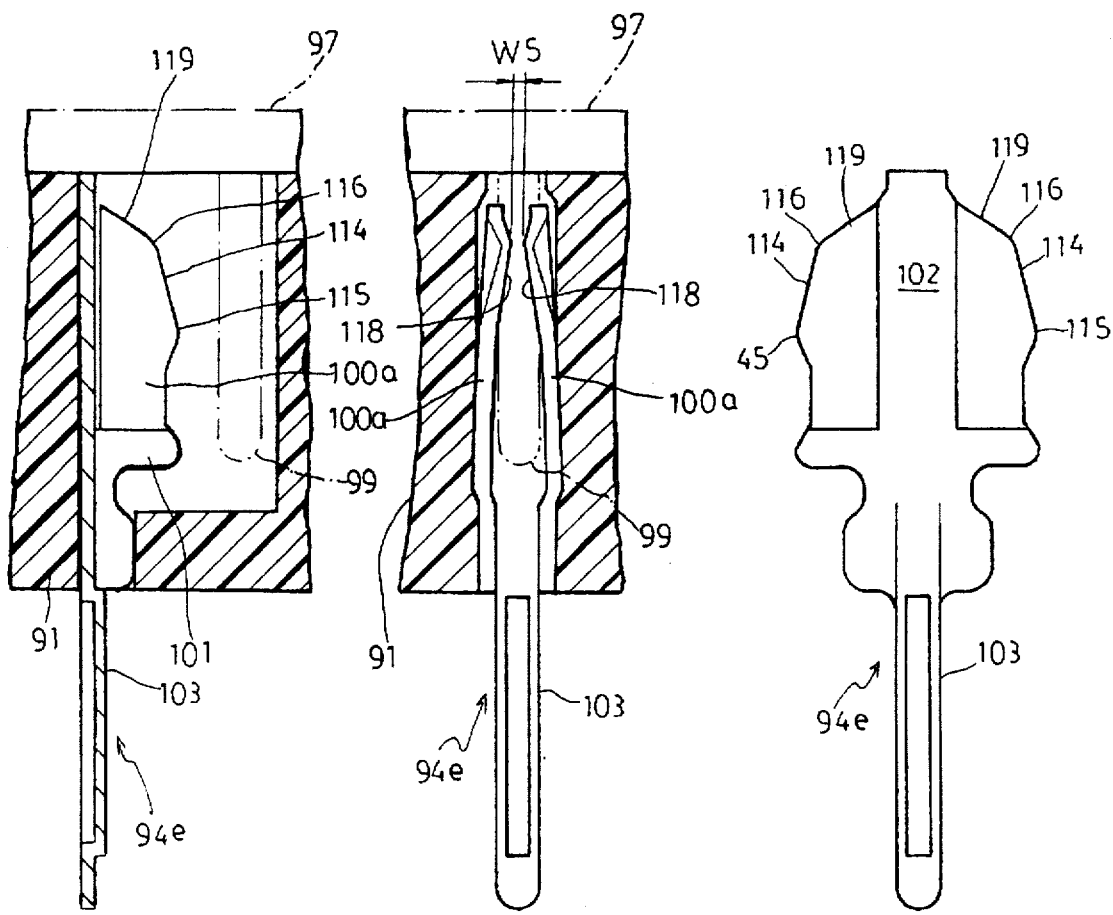
FIG. 54 is a left view of the conductive contact of FIG. 50.
FIG. 55 is a front view of the conductive contact of FIG. 50.
FIG. 56 is a front stretched view of the conductive contact of FIG. 50.
Figure 57:
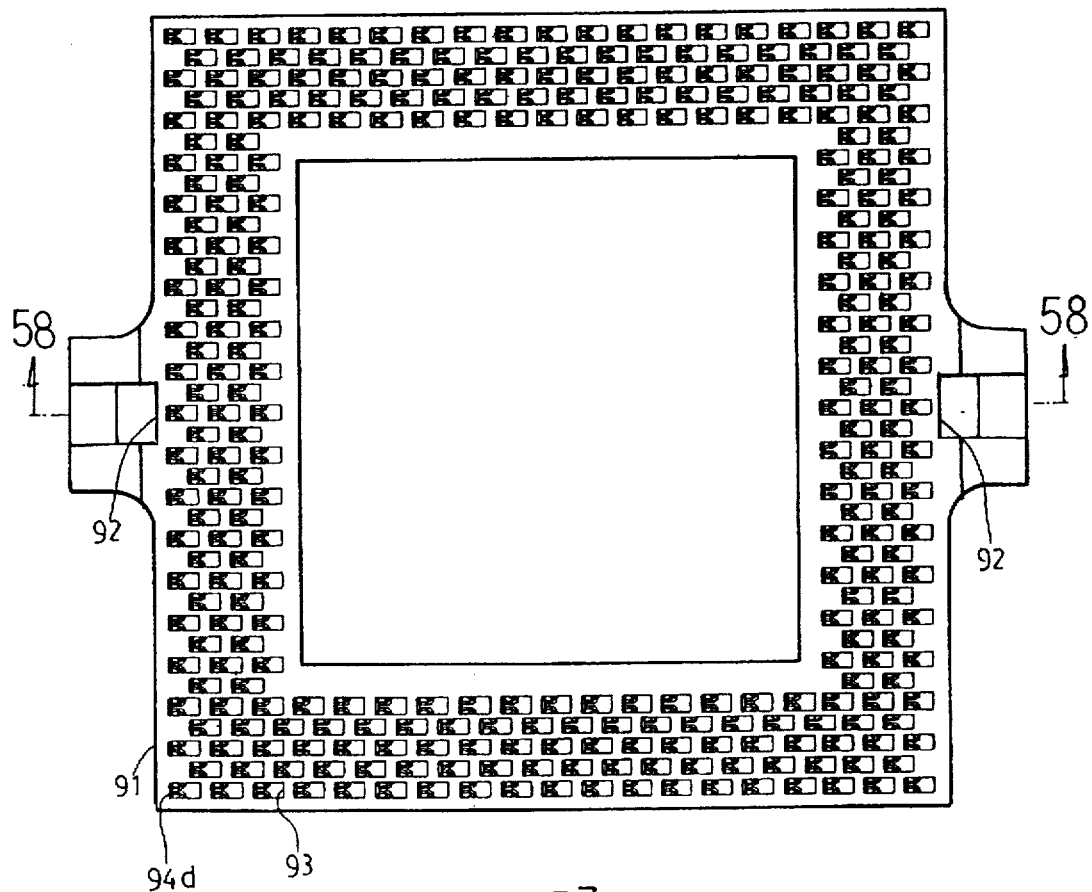
FIG. 57 is a top view of the zero insertion/extraction force socket of the present invention, wherein the conductive contacts of FIG. 43 are inserted into the insertion holes of the housing of the socket.
Figure 58:
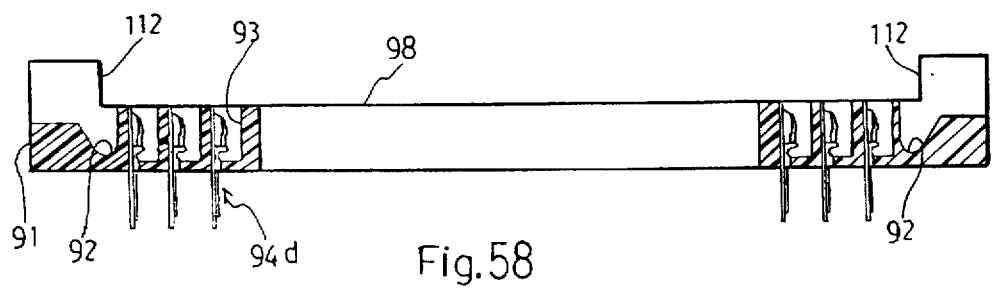
FIG. 58 is a sectional view taken along line 58—58 of FIG. 57.
Figure 59:
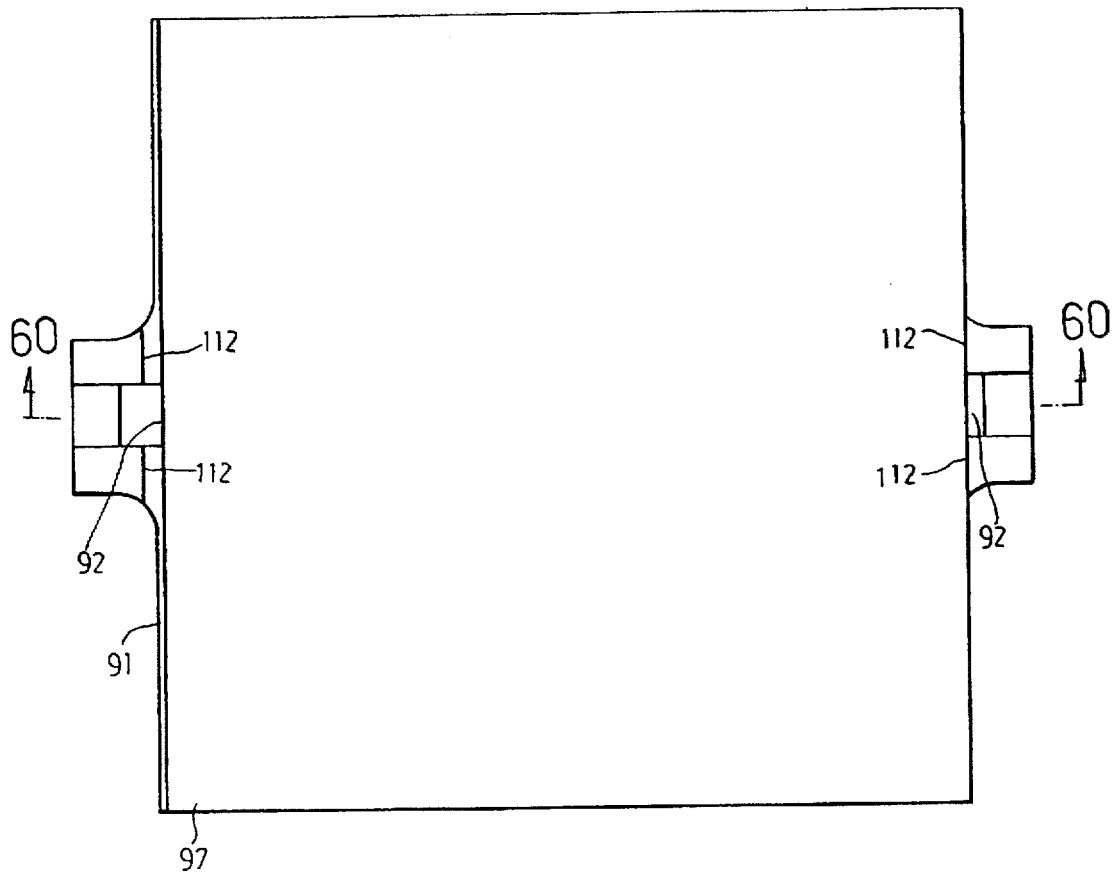
FIG. 59 is a top view showing that the insertion pins of the integrated circuit are inserted into the insertion holes of the socket of FIG. 57, prior to being slid into a contacting position.
Figure 60:
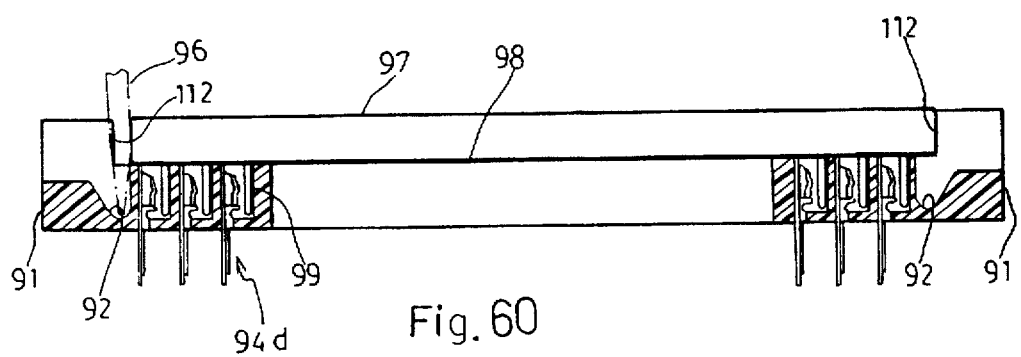
FIG. 60 is a sectional view taken along line 60—60 of FIG. 59.
Figure 61:
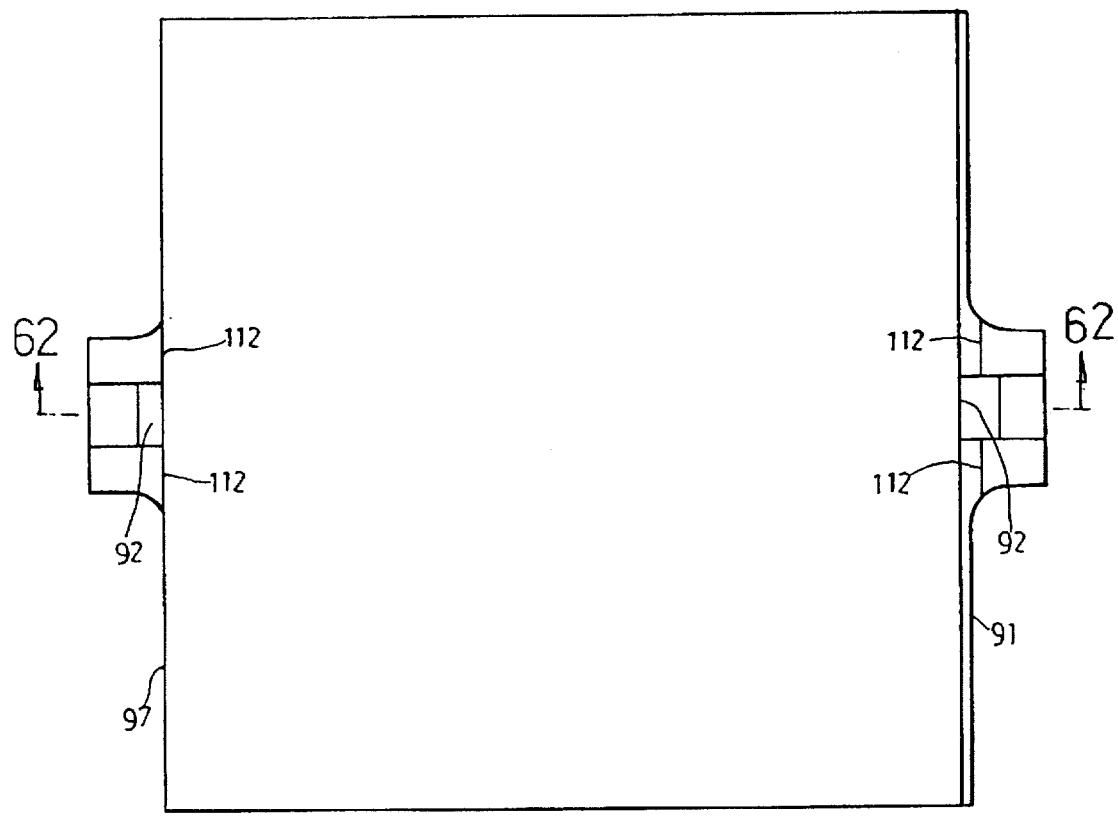
FIG. 61 is a top view according to FIG. 57, showing that a pushing piece such as a screwdriver is inserted into the right fulcrum dent to leftward push the insertion pins of the integrated circuit toward the contacting position.
Figure 62:
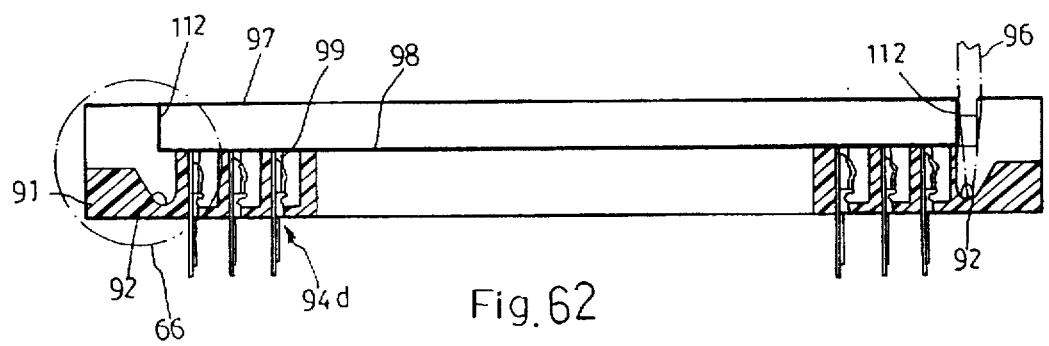
FIG. 62 is a sectional view taken along line 62—62 of FIG. 61.
Figure 63:
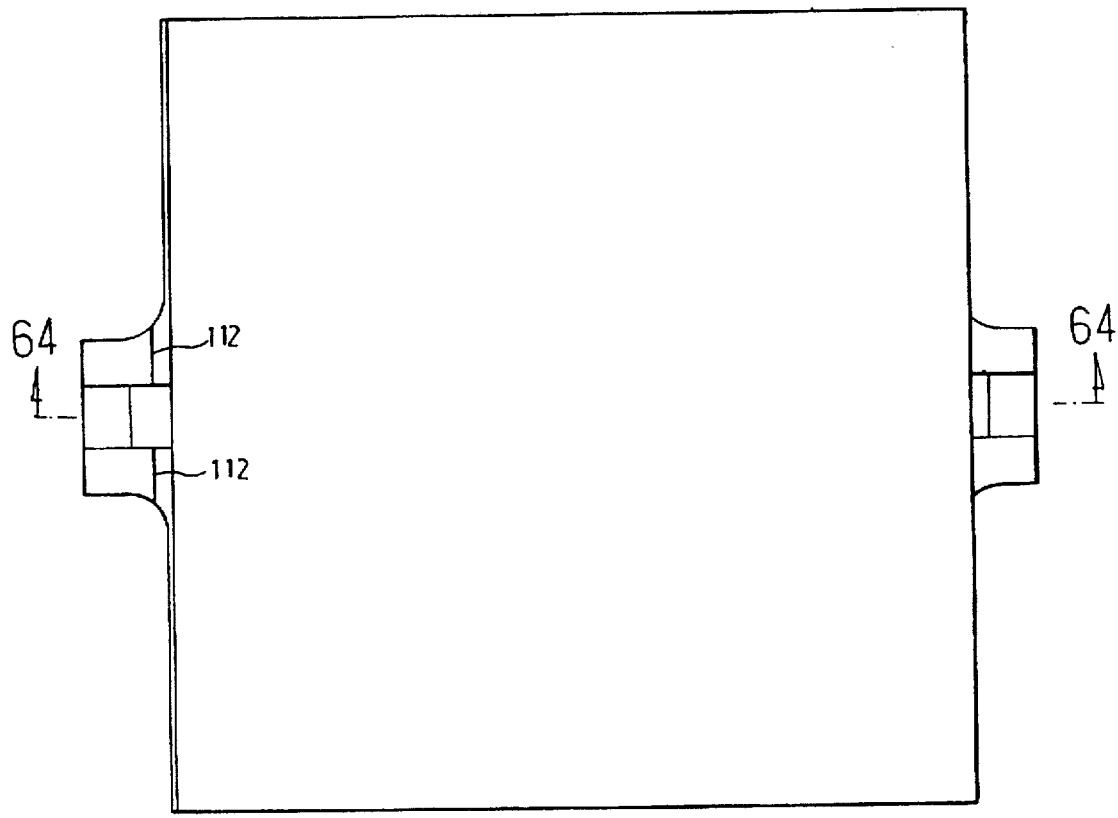
FIG. 63 is a top view according to FIG. 61, showing that the pushing piece is inserted into the left fulcrum dent to rightward push the insertion pins of the integrated circuit toward the loosening position, permitting the integrated circuit to be extracted from the socket by zero force.
Figure 64:
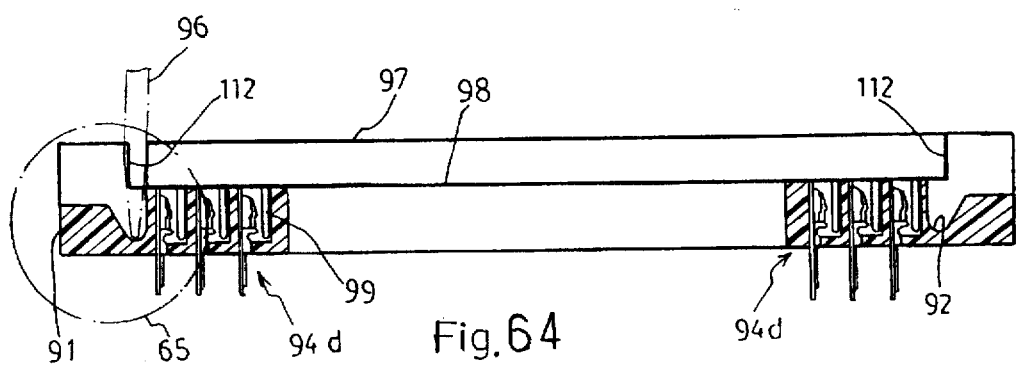
FIG. 64 is a sectional view taken along line 64—64 of FIG. 63.
Figure 65:
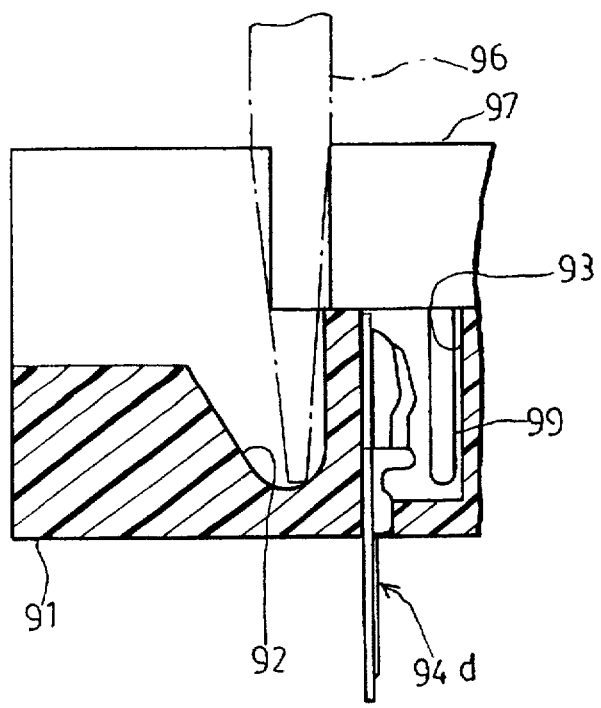
FIG. 65 is a partially enlarged view of area 65 of FIG. 64.

On one side of each of the resilient sections 100b is formed an inclined guide side 114 which is inclined rightward downward as shown in FIG. 51. A starting point 115 of the guide side 114 is positioned between the first end 104 and second end 105 of the resilient section 100b, while an ending point 116 of the guide side 114 is positioned at the second end 105 of the resilient section 100b. Also, the perpendicular distance from the starting point 115 of the guide side 114 to the main stem section 102 is larger than the perpendicular distance from the ending point 116 of the guide side 114 to the main stem section 102. When the insertion pins 99 of the integrated circuit 97 are shifted leftward from the loosening position to the contacting position as shown in FIG. 47, the insertion pins 99 will be smoothly slid into the U-shaped base section 101 having the first width W1 which is larger than the diameter D of the insertion pins 99. Then the insertion pins 99 will contact with the guide sides 114 to be guided thereby and easily slid into the space between the resilient sections 100a, 100b.

In addition, the four resilient sections 100a, 100b provide four contacting areas for the insertion pins 99 to create a better contacting effect. Moreover, the two right resilient sections 100a, 100b serve to clamp the insertion pins 99 and prevent the same from detaching from the contact 94d.

In addition, each resilient section 100b is formed with a guide angle 120 on inner side for facilitating the sliding of the insertion pins 99 between the resilient sections 100b. Other conductive contacts 94a, 94b, 94c can also be formed with such guide angles 120.

FIGS. 50 to 56 show a fifth embodiment of the conductive contact 94e which includes a U-shaped base section 101, two resilient sections 100a upward extending from two sides of the base section 101 and having inclined guide sides 114, a main stem section 102 integrally upward extending from a middle portion of the base section 101 and an insertion leg section 103 downward extending from the middle portion of the base section 101. The fifth embodiment of the conductive contact 94e is similar to the fourth embodiment of FIGS. 43 to 49 except that the contact 94e only has two resilient sections 100a each of which is formed with a clamping bent portion 118. The bent portions 118 are inward bent toward each other. The distance between the bent portions 118 is defined as the fifth width W5. The fifth width W5 is less than the second width W2, whereby the insertion pin 99 is more firmly and securely clamped between the resilient sections 100a.

Figure 15:
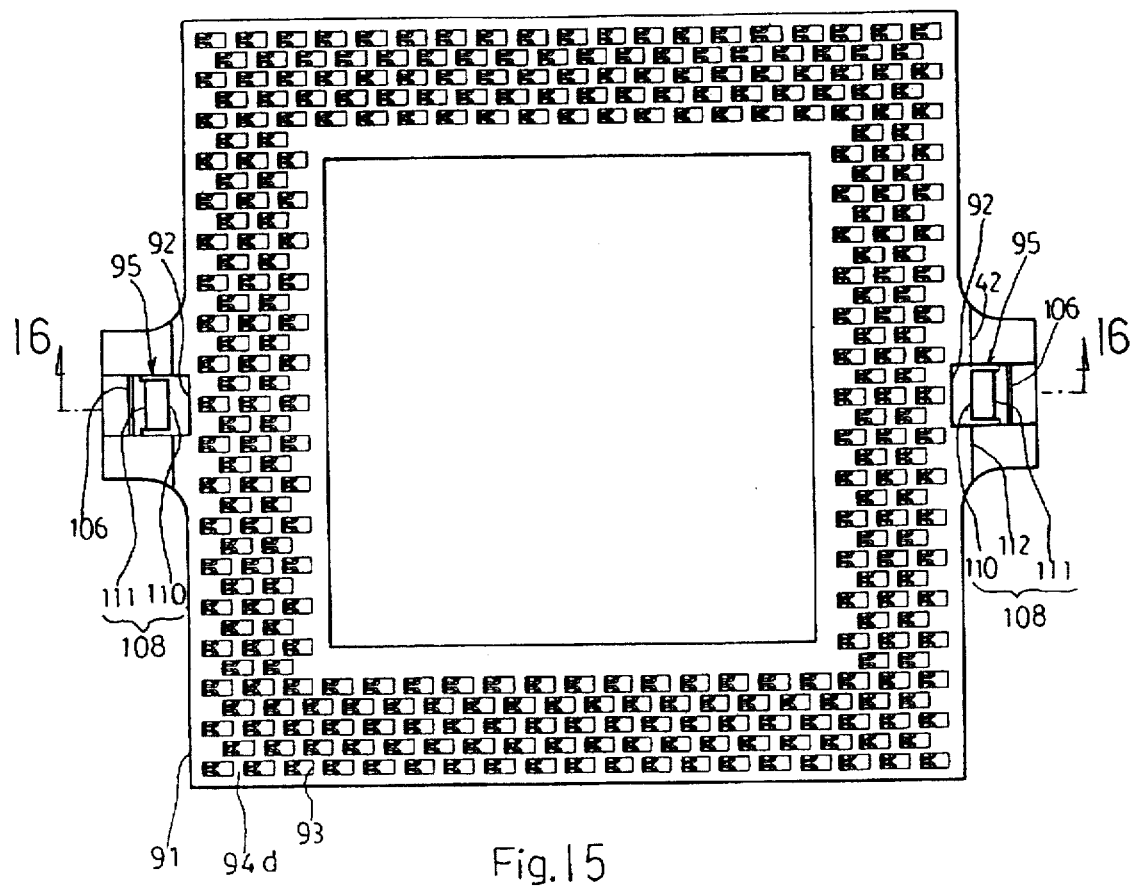
FIG. 15 is a top view of a fourth embodiment of the zero insertion/extraction force socket of the present invention.
Figure 16:
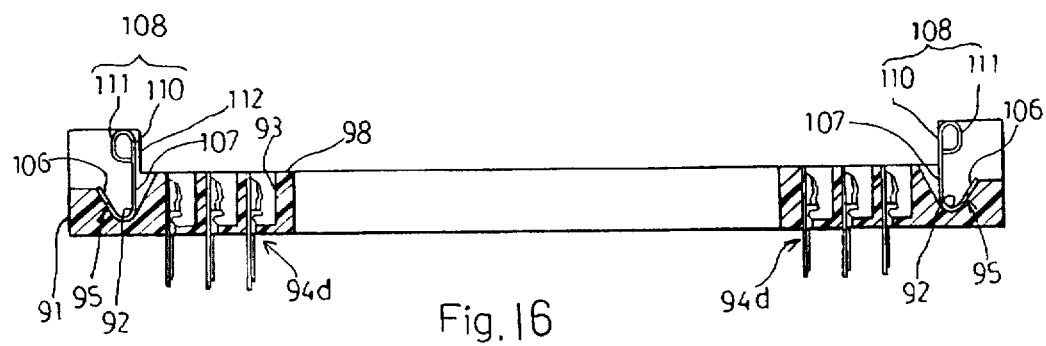
FIG. 16 is a sectional view taken along line 16—16 of FIG. 11.
Figure 17:
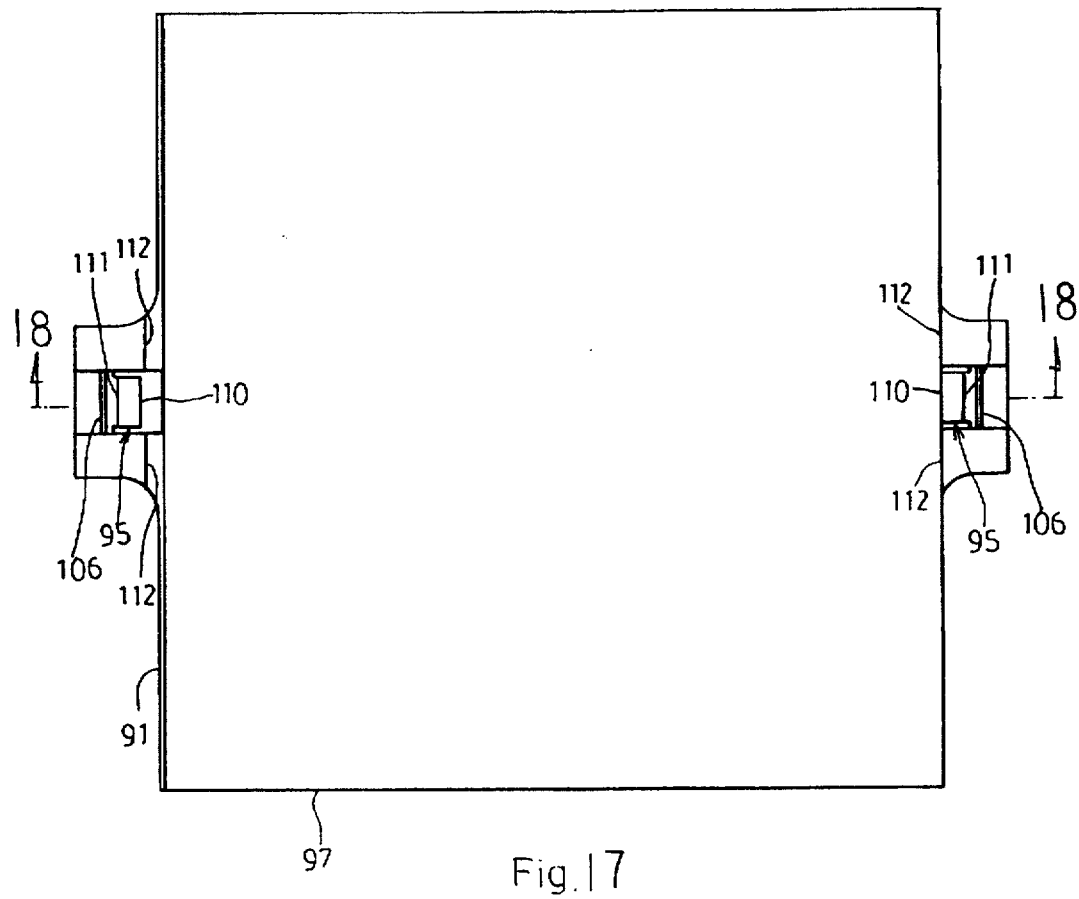
FIG. 17 is a top view showing that the insertion pins of the integrated circuit are inserted into the insertion holes of the socket of FIG. 15, prior to being slid into a contacting position.
Figure 18:
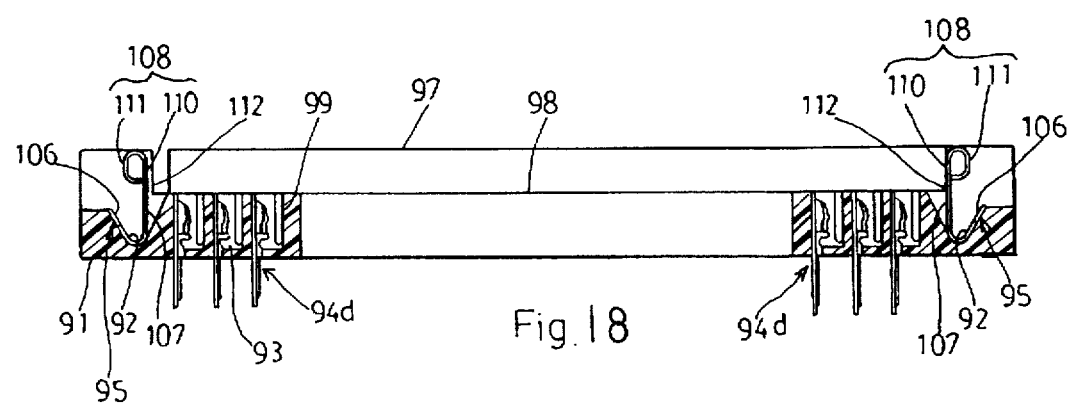
FIG. 18 is a sectional view taken along line 18—18 of FIG. 17.
Figure 19:
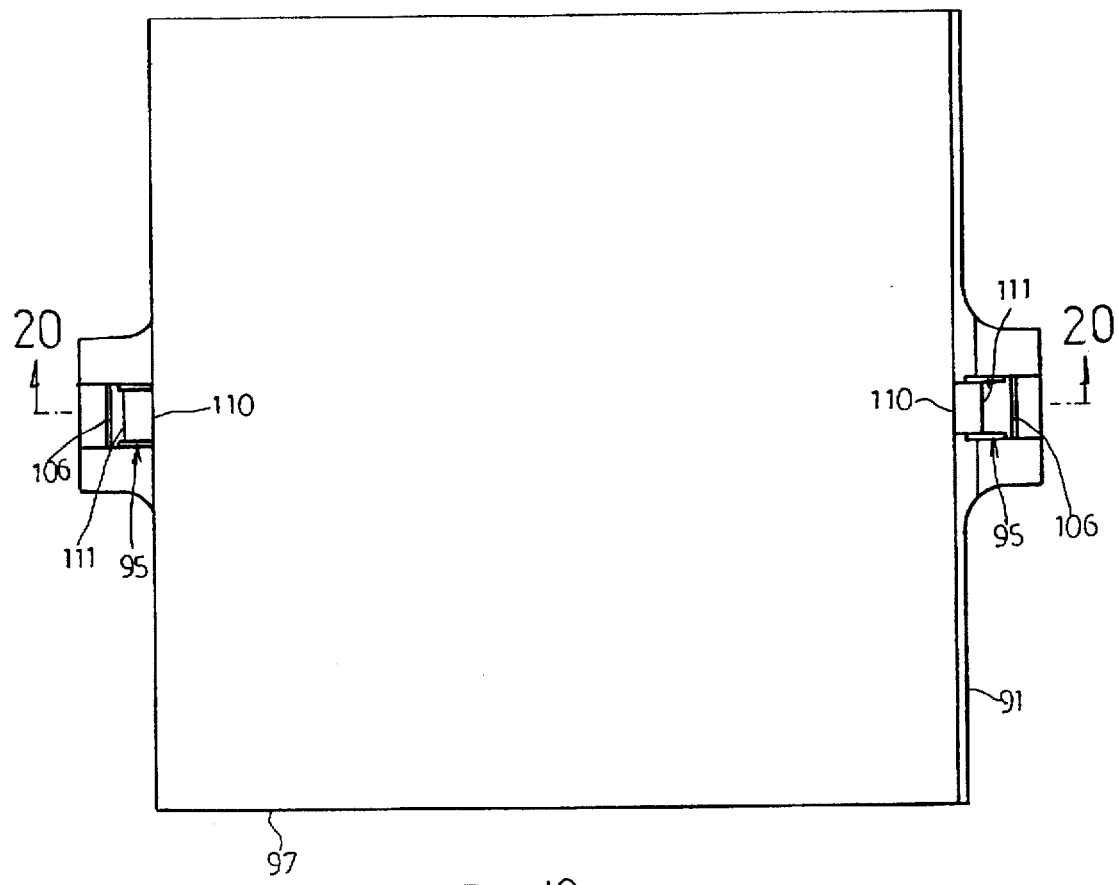
FIG. 19 is a top view according to FIG. 17, showing that a pushing piece such as a screwdriver is inserted into the right fulcrum dent to leftward push the insertion pins of the integrated circuit toward the contacting position.
Figure 20:
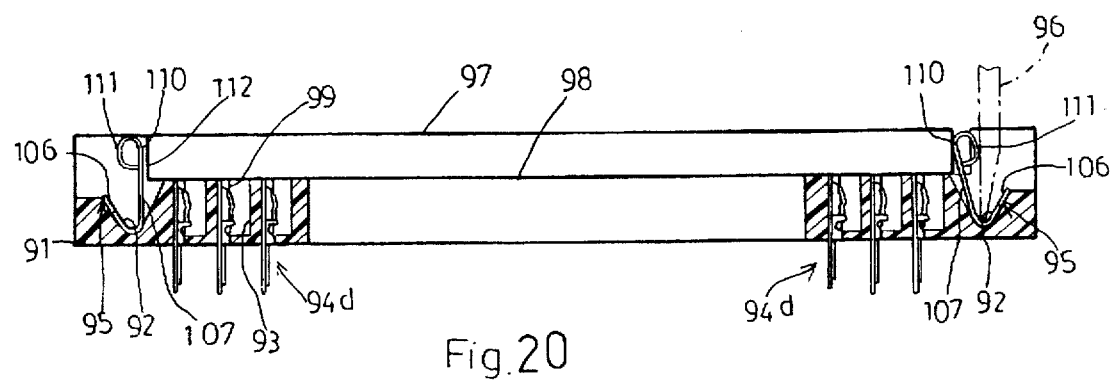
FIG. 20 is a sectional view taken along line 20—20 of FIG. 19.
Figure 21:
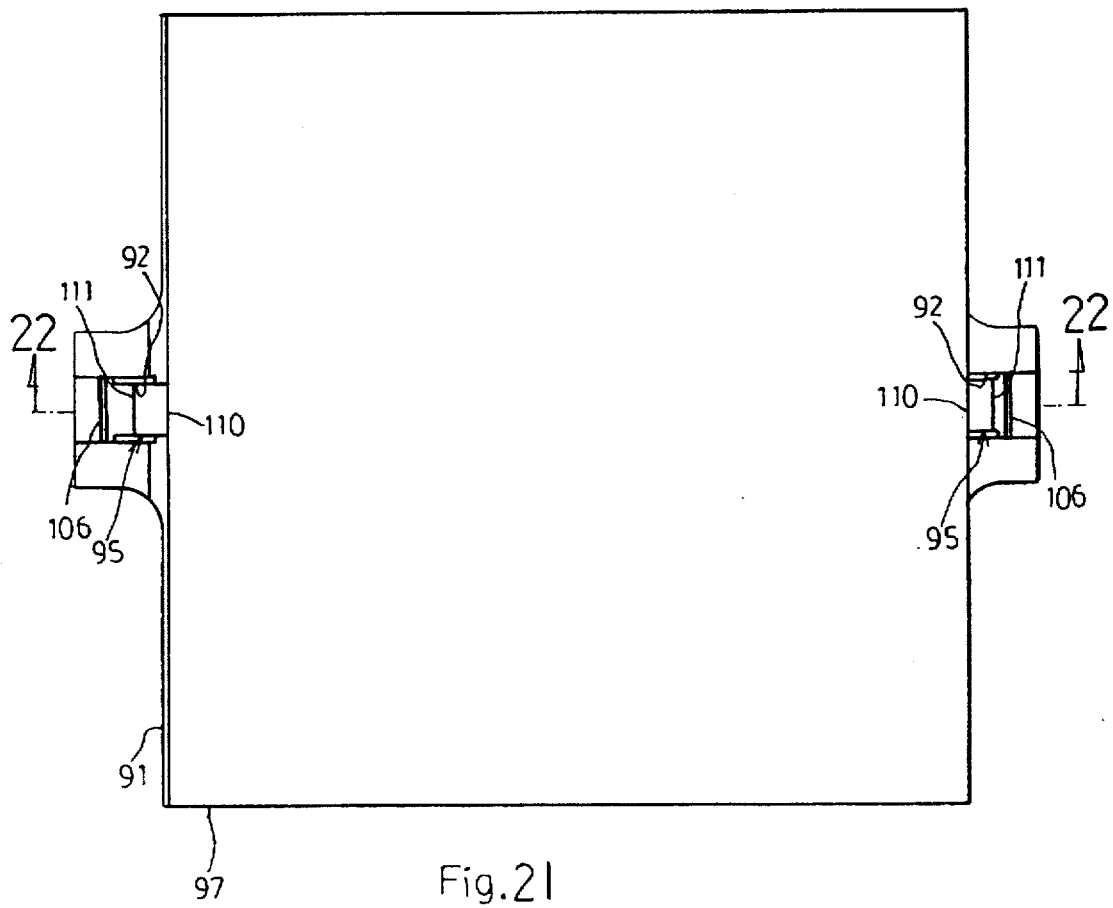
FIG. 21 is a top view according to FIG. 19, showing that the pushing piece is inserted into the left fulcrum dent to rightward push the insertion pins of the integrated circuit toward the loosening position.
Figure 22:
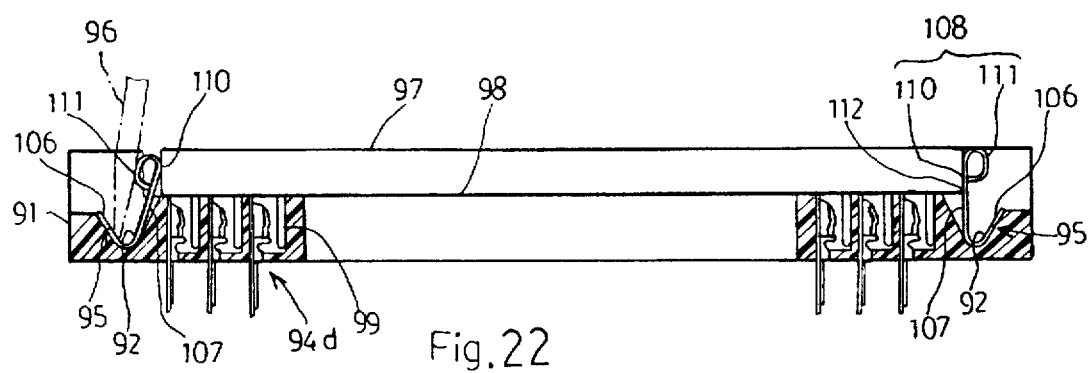
FIG. 22 is a sectional view taken along line 22—22 of FIG. 21.
Figure 23:
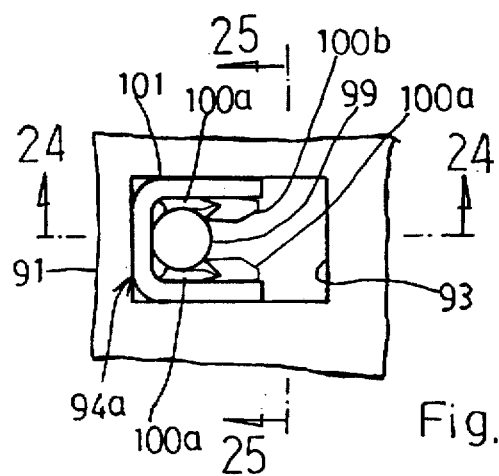
FIG. 23 is a partially enlarged view of area 23 of FIG. 5.
Figures 24, 25:
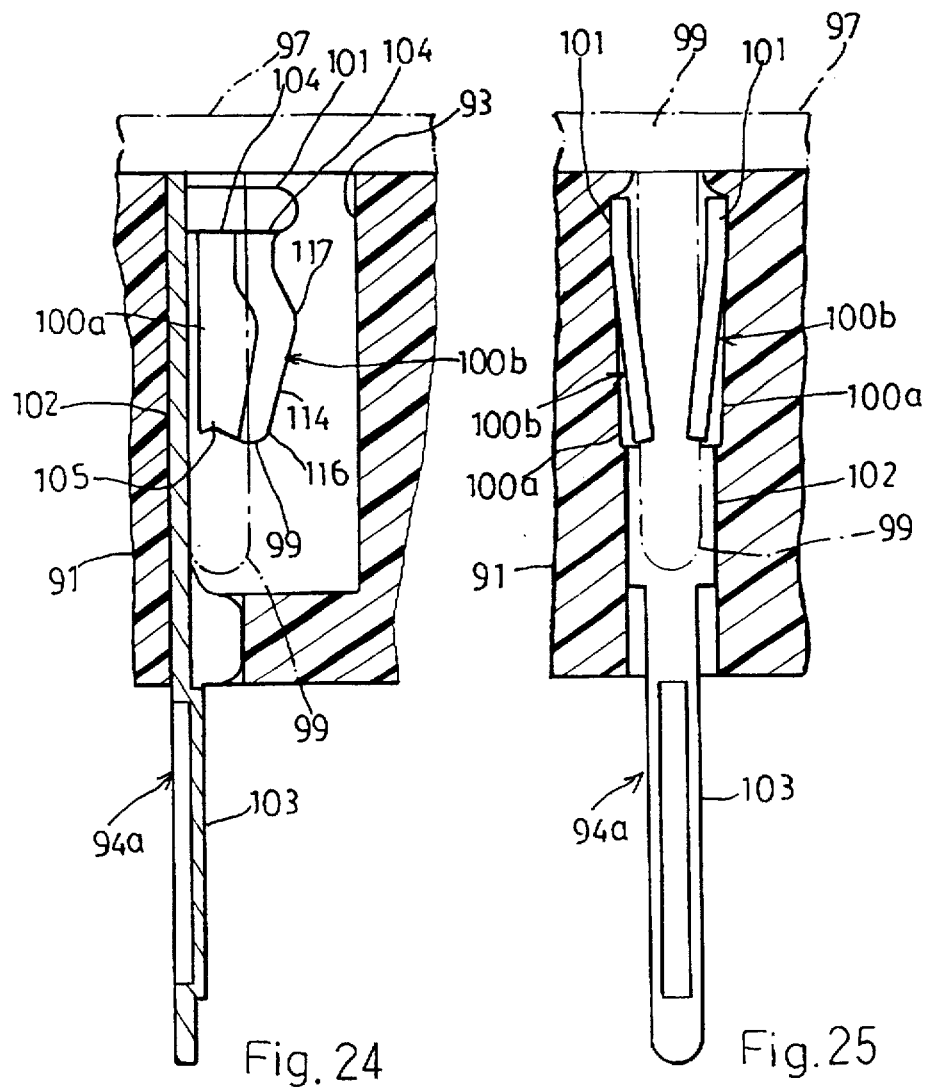
FIG. 24 is a sectional view taken along line 24—24 of FIG. 23.
FIG. 25 is a sectional view taken along line 25—25 of FIG. 23.
Figure 30:
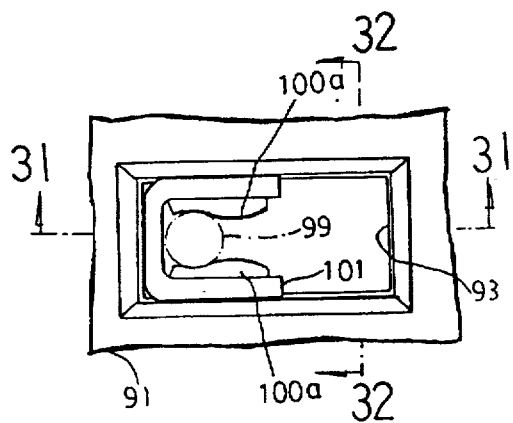
FIG. 30 is a top view of a second embodiment of the conductive contact of the present invention, wherein the insertion pin contacts with the conductive contact.
Figures 31, 32:
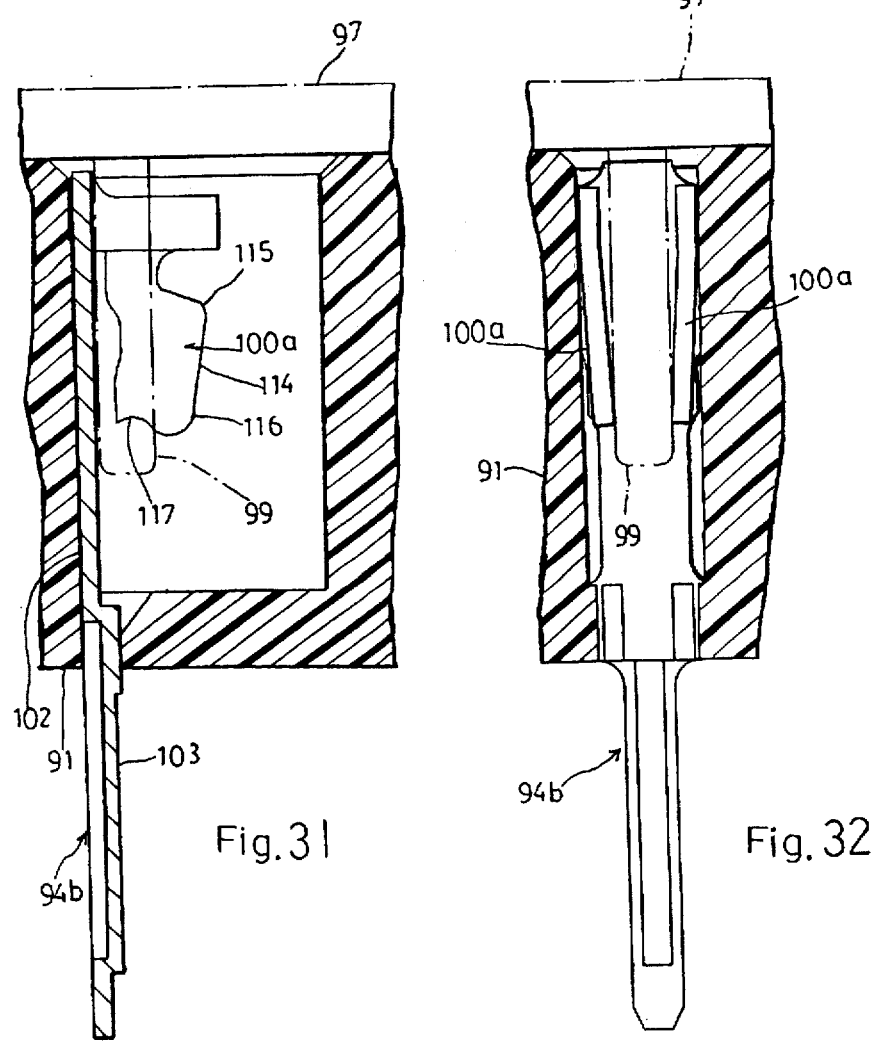
FIG. 31 is a sectional view taken along line 31—31 of FIG. 30.
FIG. 32 is a sectional view taken along line 32—32 of FIG. 30.
Figure 33:
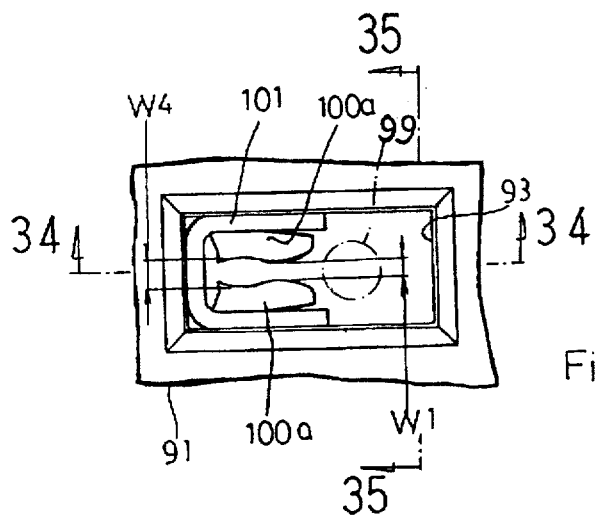
FIG. 33 is a top view of the second embodiment of the conductive contact of the present invention, wherein the insertion pin loosens from the conductive contact.
Figure 34:
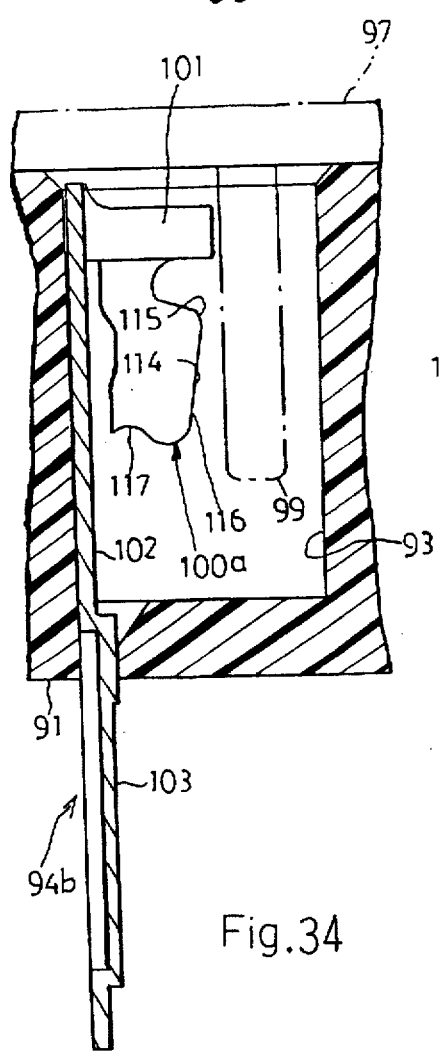
FIG. 34 is a sectional view taken along line 34—34 of FIG. 33.
Figure 35:
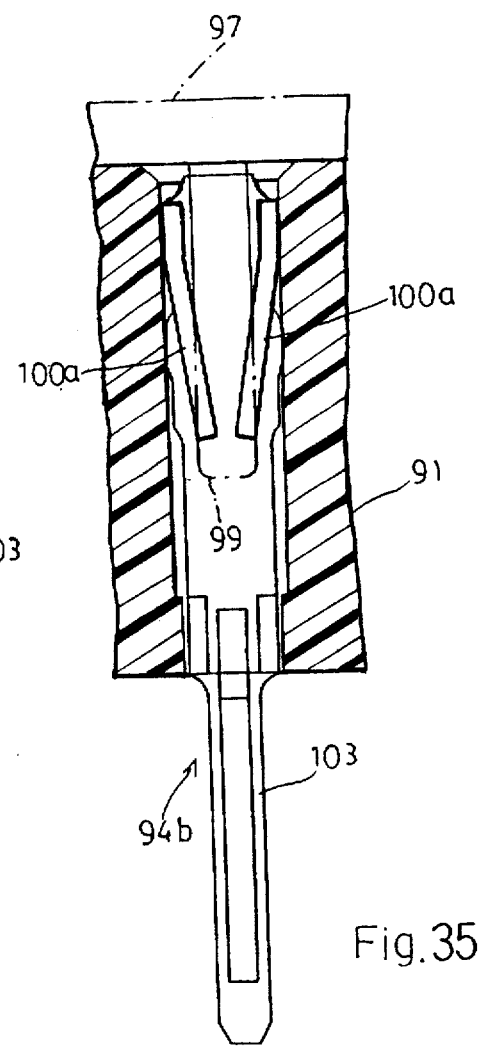
FIG. 35 is a sectional view taken along line 35—35 of FIG. 33.
Figure 36:
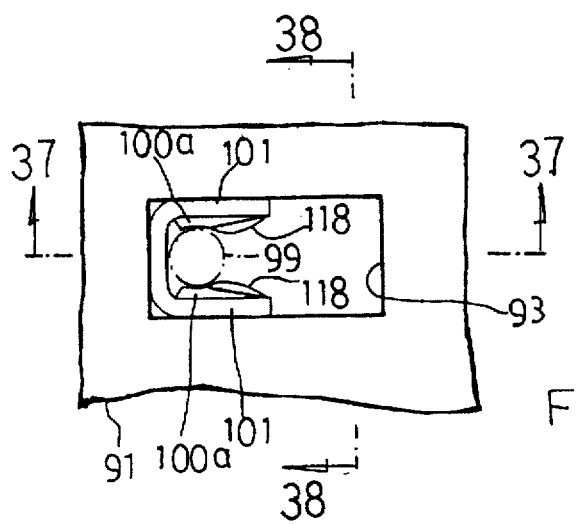
FIG. 36 is a top view of a third embodiment of the conductive contact of the present invention, wherein the insertion pin contacts with the conductive contact.
Figures 37, 38:
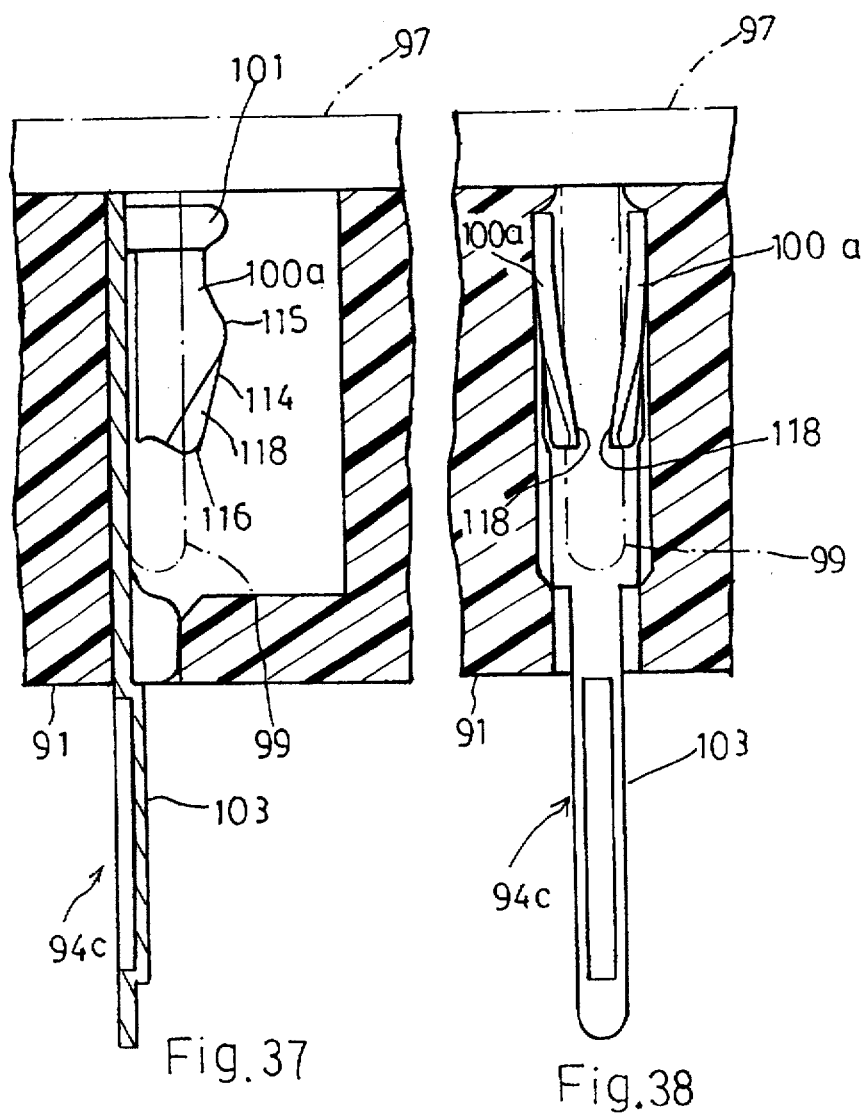
FIG. 37 is a sectional view taken along line 37—37 of FIG. 36.
FIG. 38 is a sectional view taken along line 38—38 of FIG. 36.
Figure 43:
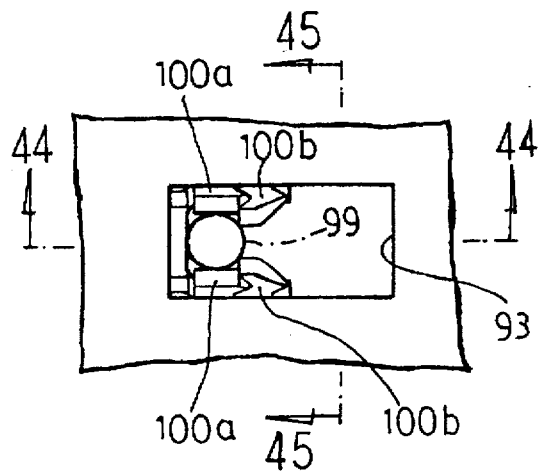
FIG. 43 is a top view of a fourth embodiment of the conductive contact of the present invention, wherein the insertion pin contacts with the conductive contact.
Figures 44, 45:
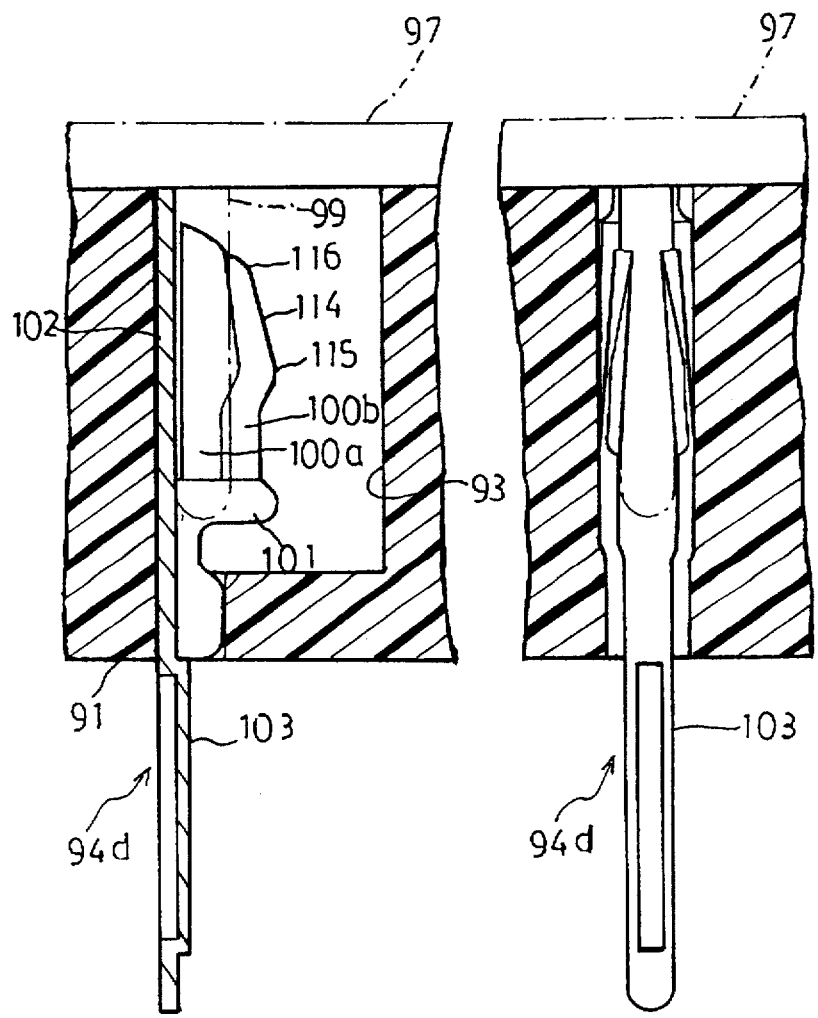
FIG. 44 is a sectional view taken along line 44—44 of FIG. 43.
FIG. 45 is a sectional view taken along line 45—45 of FIG. 43.
Figure 50:
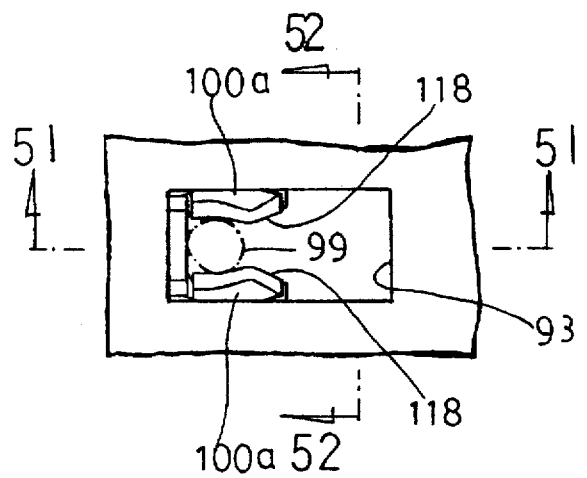
FIG. 50 is a top view of a fifth embodiment of the conductive contact of the present invention, wherein the insertion pin contacts with the conductive contact.

Referring to FIGS. 17 and 18, when the integrated circuit 97 is inserted into the socket as shown in FIGS. 15 and 16, the insertion pins 99 of the integrated circuit 97 are positioned right above and aligned with the insertion holes 93 and then inserted thereinto. When doing this, the insertion pins 99 will first contact with the guide sides 119 or arch sides of the resilient sections and be guided into the insertion holes 93 thereby. When the insertion pins 99 of the integrated circuit 97 are shifted leftward from the loosening position to the contacting position as shown in FIG. 47, the insertion pins 99 will be smoothly slid into the U-shaped base section 101 and the first width W1 which is larger than the diameter D of the insertion pins 99. Then the insertion pins 99 will contact with the inclined guide sides 114 and be guided thereby into the space between the resilient sections 100a and 100b.

According to the above arrangements, the present invention has the following advantages:

1. The volume of the zero insertion/extraction force socket is minimized to meet the requirements of lightweight, thin, short, and small socket products.

2. The conductive contacts can be still easily inserted into or extracted from the insertion holes.

3. The structure of the socket is more simplified and the socket is easily manufactured and the quality of the product is more easily controlled.

It is to be understood that the above description and drawings are only used for illustrating some embodiments of the present invention, not intended to limit the scope thereof. Any variation or derivation from the above description and drawings should be included in the scope of the present invention.

What is claimed is:

1. A zero insertion/extraction force socket assembly for a printed circuit board adapted for mated coupling with an integrated circuit chip having a plurality of insertion pins extending therefrom comprising:

(a) an insulative housing portion having a substantially planar contour extending in a lateral direction and having formed therein a plurality of insertion holes, each of said insertion holes being adapted for insert therein of at least one of said insertion pins;

(b) a plurality of conductive contact members respectively disposed in said insertion holes of said insulative housing portion, each of said conductive contact members being adapted to engage said printed circuit board in electrically conductive manner;

(c) a pair of fulcrum dent portions disposed adjacent said insulative housing portion, each of said fulcrum dent portions having formed therein a recess adapted for supportingly receiving a portion of a preselected implement for substantially forming a lever fulcrum thereat, whereby said preselected implement may be pivotally displaced about said lever fulcrum to impart sufficient force to laterally displace said integrated circuit chip relative to said socket assembly from a first position to a second position, said insertion pins of said integrated circuit chip contacting said conductive contact members in electrically conductive manner when said integrated circuit chip is in one of said first and second positions; and, (d) a metallic protection member received within at least one of said fulcrum dent portions, said metallic protection member substantially lining said recess of said fulcrum dent portion for protecting said recess from surface damage.

2. The zero insertion/extraction force socket assembly as recited in claim 1 wherein each said conductive contact member includes:

(a) a main stem section extending in a longitudinal direction, said main stem section having longitudinally opposed upper and lower end portions;

(b) a base section disposed adjacent said first upper end portion of said main stem section, said base section including a pair of arm portions extending in a direction transverse to said longitudinal direction;

(c) at least a pair of resilient clamping sections respectively extending longitudinally from said arm portions, said resilient clamping sections being adapted to resiliently capture therebetween one of said insertion pins of said integrated circuit chip; and, (d) an insertion leg section disposed adjacent said lower end portion of said main stem section, said insertion leg section extending in said longitudinal direction for insert into said printed circuit board.

3. The zero insertion/extraction force socket assembly as recited in claim 2 wherein each of said resilient clamping sections each includes longitudinally opposed first and second end portions connected by an intermediate portion, said first end portion being integrally joined to one of said arm portions of said base section, said first end portions of said resilient clamping sections being resiliently biased to maintain a first predetermined separation distance one from the other, said second end portions being resiliently biased to maintain a second predetermined separation distance one from the other, said first predetermined separation distance being greater than the thickness dimension of one of said integrated circuit chip insertion pins, said second predetermined separation distance being less than the thickness dimension of one of said integrated circuit chip insertion pins.

4. The zero insertion/extraction force socket assembly as recited in claim 3 wherein said intermediate portion of each said resilient clamping section extends in a direction transverse to said longitudinal direction farther from said main stem section than does said second end portion, said intermediate and second end portions defining at each resilient clamping section an inclined guide portion for guiding said integrated circuit chip insertion pin during said lateral displacement of said integrated circuit chip relative to said socket assembly between said first and second positions.

5. The zero insertion/extraction force socket assembly as recited in claim 3 wherein each of said resilient clamping sections has formed adjacent said second end portion thereof a notched portion, said notched portions of said resilient clamping sections beginning resiliently biased to maintain a predetermined notch separation distance one from the other, said notch separation distance being less than said first predetermined separation distance and greater than said second predetermined separation distance, said notch separation distance being less than the thickness dimension of one of said integrated circuit chip insertion pins.

6. The zero insertion/extraction force socket assembly as recited in claim 4 wherein each of said resilient clamping sections includes a clamping bent portion tapered inward toward the other of said clamping sections.

7. The zero insertion/extraction force socket assembly as recited in claim 1 wherein each said conductive contact member includes:

(a) a base section having an upper side and a lower side, said base section including a pair of arm portions extending in a direction transverse to a longitudinal direction;

(b) a main stem section disposed adjacent said upper side of said base section to extend longitudinally therefrom;

(c) at least a pair of resilient clamping sections respectively extending longitudinally from said arm portions, said resilient clamping sections being adapted to resiliently capture therebetween one of said insertion pins of said integrated circuit chip; and, (d) an insertion leg section disposed adjacent said lower side of said base section to extend longitudinally therefrom, said insertion leg section being adapted for insert into said printed circuit board.

8. The zero insertion/extraction force socket assembly as recited in claim 7 wherein each of said resilient clamping sections each includes longitudinally opposed first and second end portions connected by an intermediate portion, said first end portion being integrally joined to one of said arm portions of said base section, said first end portions of said resilient clamping sections being resiliently biased to maintain a first predetermined separation distance one from the other, said second end portions being resiliently biased to maintain a second predetermined separation distance one from the other, said first predetermined separation distance being greater than the thickness dimension of one of said integrated circuit chip insertion pins, said second predetermined separation distance being less than the thickness dimension of one of said integrated circuit chip insertion pins.

9. The zero insertion/extraction force socket assembly as recited in claim 8 wherein said intermediate portion of each said resilient clamping section extends in a direction transverse to said longitudinal direction farther from said main stem section than does said second end portion, said intermediate and second end portions defining at each resilient clamping section an inclined guide portion for guiding said integrated circuit chip insertion pin during said lateral displacement of said integrated circuit chip relative to said socket assembly between said first and second positions.

10. The zero insertion/extraction force socket assembly as recited in claim 8 wherein said second end portion of each said resilient clamping section has formed thereon an auxiliary inclined guide portion connected to said inclined guide portion to extend longitudinally therefrom, said auxiliary inclined guide and said inclined guide portions being characterized by different incline angles.

11. The zero insertion/extraction force socket assembly as recited in claim 8 wherein each of said resilient clamping sections includes a clamping bent portion tapered inward toward the other of said clamping sections.

12. The zero insertion/extraction force socket assembly as recited in claim 4 or claim 9 wherein said inclined guide portion of each said resilient clamping section includes a slant surface substantially opposing the other of said resilient clamping sections for abuttingly and guiding said integrated circuit chip insertion pin during said lateral displacement of said integrated circuit chip relative to said socket assembly between said first and second positions.

13. The zero insertion/extraction force socket assembly as recited in claim 2 or claim 7 wherein said conductive contact member includes first and second pairs of said resilient clamping members, said second pair of resilient clamping members being disposed farther from said main stem section than said first pair of resilient clamping members.

\* \* \* \* \*